United States Patent
Makita et al.

(10) Patent No.: US 8,575,713 B2
(45) Date of Patent: Nov. 5, 2013

(54) SEMICONDUCTOR DEVICE AND DISPLAY DEVICE

(75) Inventors: Naoki Makita, Osaka (JP); Masahiro Fujiwara, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 217 days.

(21) Appl. No.: 13/201,603

(22) PCT Filed: Feb. 12, 2010

(86) PCT No.: PCT/JP2010/000869
§ 371 (c)(1),
(2), (4) Date: Aug. 15, 2011

(87) PCT Pub. No.: WO2010/095401
PCT Pub. Date: Aug. 26, 2010

(65) Prior Publication Data
US 2011/0297936 A1    Dec. 8, 2011

(30) Foreign Application Priority Data
Feb. 19, 2009    (JP) .................. 2009-037181

(51) Int. Cl.
H01L 31/0376    (2006.01)
H01L 31/105    (2006.01)
H01L 21/00    (2006.01)

(52) U.S. Cl.
USPC .............. 257/458; 257/53; 257/80; 257/656; 257/E31.047; 257/E31.061; 438/96

(58) Field of Classification Search
USPC ............. 257/53, 80, 458, 656, E31.047, 257/E31.061; 438/96
See application file for complete search history.

(56) References Cited

U.S. PATENT DOCUMENTS

| 5,501,989 A | 3/1996 | Takayama et al. |
| 5,589,694 A | 12/1996 | Takayama et al. |

(Continued)

FOREIGN PATENT DOCUMENTS

| JP | 63-058975 | * | 3/1988 | ............. 31/10 |
| JP | 63-058975 A | | 3/1988 | |

(Continued)

OTHER PUBLICATIONS

Tanaka et al., "Amorphous Handotai no Kiso", 1st edition, Ohmsha, Ltd., May 25, 1982, pp. 87 to 95, Tokyo, Japan. Cited in ISR as a concise explanation of relevance.
International Search Report (ISR) issued in PCT/JP2010/000869 (International application) mailed in May 2010 for Examiner consideration.

*Primary Examiner* — Victor A Mandala
(74) *Attorney, Agent, or Firm* — Chen Yoshimura LLP

(57) ABSTRACT

A semiconductor device 700 includes a substrate and an optical sensor unit 700 formed on the substrate for sensing light and for generating a sensing signal, the optical sensor unit 700 including a first thin film diode 701A for detection of light in a first wavelength range, a second thin film diode 701B detecting light in a second wavelength range that contains wavelengths longer than the longest wavelength in the first wavelength range. The first thin film diode 701A and the second thin film diode 701B are connected in parallel to each other. The sensing signal is generated based on the output from one of the first thin film diode 701A and the second thin film diode 701B. By this means, the wavelength range that can be detected by the optical sensor unit can be expanded and the sensing sensitivity can be increased.

20 Claims, 16 Drawing Sheets

(56) References Cited

U.S. PATENT DOCUMENTS

| | | |
|---|---|---|
| 5,744,822 A | 4/1998 | Takayama et al. |
| 2005/0087829 A1* | 4/2005 | Merrill et al. ................. 257/440 |
| 2008/0315106 A1* | 12/2008 | Buchinsky ............... 250/370.09 |
| 2010/0065851 A1 | 3/2010 | Makita |

FOREIGN PATENT DOCUMENTS

| | | |
|---|---|---|
| JP | H06-275807 A | 9/1994 |
| JP | H06-275808 A | 9/1994 |
| JP | 2005-275644 A | 10/2005 |
| WO | 2008/132862 A1 | 11/2008 |

* cited by examiner (A)

(B)

(C)

(D)

(E)

(F)

(G)

(H)

US 8,575,713 B2

SEMICONDUCTOR DEVICE AND DISPLAY DEVICE

TECHNICAL FIELD

The present invention relates to a semiconductor device and a display device equipped with an optical sensor unit that includes a thin film diode (TFD).

BACKGROUND ART

Development has progressed in recent years for electronic devices such as display devices, image sensors, or the like, equipped with optical sensor units utilizing TFDs.

Patent Documents 1 and 2 disclose image sensors that provide on the same substrate an optical sensor unit using a TFD and a drive circuit using a thin film transistor (TFT). According to Patent Document 1, due to crystallization of only part of an amorphous semiconductor film, from the same amorphous semiconductor film, an amorphous semiconductor layer is formed for producing the TFD active region and a crystalline semiconductor layer is formed for producing the TFT active region. Moreover, according to Patent Document 2, the TFT and TFD semiconductor layer is a crystalline semiconductor layer that is obtained by causing crystallization of the same amorphous semiconductor film.

Furthermore, Patent Document 3 proposes forming from the same amorphous semiconductor film TFD and TFT semiconductor layers that have mutually different crystallization states. Such a TFD and TFT, for example, can be used for a display device equipped with an optical type touch panel. Since this type of display device is equipped with an optical sensor using a TFD in the liquid crystal display device display region, this type of display device is able to utilize ambient light to sense an object such as a finger or the like contacting the display face.

FIG. 17 is a circuit diagram showing an example of structure of an optical sensor unit disclosed in Patent Document 3. The optical sensor unit has a thin film diode 1701 for an optical sensor, a capacitor 1702 for retaining a signal, and a thin film transistor 1703 for reading the signal accumulated in the capacitor 1702. After an RST signal is input and the RST potential is written to a node 1704, when the node 1704 potential drops due to photo leakage, the gate potential of the thin film transistor 1703 changes, and the TFT gate opens or closes. The signal VDD can be read out by this means.

On the other hand, in Patent Document 4, a display device provided with an optical type touch panel is proposed that uses a sensor for detection of invisible radiation to sense invisible radiation emitted from a backlight. According to the display device disclosed in Patent Document 4, radiation emitted from the backlight reflects from an object such as a finger or the like contacting the screen, and the reflected invisible light is detected by sensors arranged at each pixel of the display device.

RELATED ART DOCUMENT

Patent Documents

Patent Document 1: Japanese Patent Application Laid-open Publication No. H6-275807
Patent Document 2: Japanese Patent Application Laid-open Publication No. H6-275808
Patent Document 3: WO 2008/132862
Patent Document 4: Japanese Patent Application Laid-open Publication No. 2005-275644

SUMMARY OF THE INVENTION

Problems to be Solved by the Invention

During investigation by the inventors of the present invention, it was found that there was concern that, depending on the environment of use of a liquid crystal display device equipped with a conventional optical type touch panel, the liquid crystal display device might not be able to sufficiently perform sensing.

For example, although the liquid crystal display device disclosed in Patent Document 3 performs sensing by use of visible radiation such as ambient light or the like, sufficient ambient light might not enter the display region due to the environment in which the display device is used. In this case, light emitted from the backlight (abbreviated as "backlight light") must be used to carry out sensing of the object contacting the screen. Backlight light passes through the display panel, is reflected by an object such as a finger or the like, and enters an optical sensor unit arranged within the display region. Therefore, sensing of the object contacting the screen is possible due to sensing of the incident light.

However, the backlight light passing through the liquid crystal layer is blocked by the observer-side polarization plate at those pixels where the display panel displays "black," and the backlight light does not reach the object contacting the screen. For this reason, depending on the display image, there is a possibility of decreased sensing sensitivity when using backlight light.

In contrast, when a sensor (e.g., an infrared sensor) for sensing invisible radiation is placed in the display region as proposed in Patent Document 4, and when sensing is carried out using infrared radiation emitted from the backlight, it is possible to overcome the above described type of problem of dependency on the screen image. Infrared light differs from visible light in that infrared light passes through the polarization plate even when black is being displayed by the pixel. Therefore, by use of infrared radiation, it becomes possible to perform sensing with a certain sensitivity without dependency on the display image.

However, the sensor (e.g., infrared sensor) used by the display device of Patent Document 4 does not have high sensing sensitivity with respect to visible light. Thus, in instances in which there is no need for using the backlight light, such as when sufficient ambient light enters the display panel or the like, sufficient sensing is not possible using visible light.

It has been difficult in this manner, when using the conventional display device equipped with an optical sensor unit, to realize high sensing performance independent of the intensity of ambient light or independent of the display image.

In consideration of the above described circumstances, the object of the present invention is to provide a semiconductor device equipped with an optical sensor unit that is capable of good sensing over a wide wavelength range. An object of the present invention is also to provide a display device that has the above described sensor unit formed in the display region and that has a touch sensor or image sensor function.

Means for Solving the Problems

A semiconductor device of the present invention includes: a substrate and an optical sensor unit for sensing light and generating a sensing signal; where the optical sensor unit includes a first thin film diode for sensing light of a first wavelength range, and a second thin film diode for sensing light of a second wavelength range including a wavelength longer than a maximum wavelength of the first wavelength range; where the first thin film diode and the second thin film diode are connected together in parallel; and the sensing signal is generated based on output of either the first thin film diode or the second thin film diode.

In a certain preferred embodiment, the first thin film diode has a first semiconductor layer; the second thin film diode has a second semiconductor layer; and the bandgap of the first semiconductor layer is greater than the bandgap of the second semiconductor layer.

In a certain preferred embodiment, the bandgap of the first semiconductor layer is greater than 1.39 eV, and the bandgap of the second semiconductor layer is less than 1.30 eV.

In a certain preferred embodiment, the crystalline state of the first semiconductor layer differs from the crystalline state of the second semiconductor layer. The first semiconductor layer is preferably an amorphous semiconductor layer, and the second semiconductor layer may be a crystalline semiconductor layer.

The thickness of the first semiconductor layer may be greater than thickness of the second semiconductor layer.

A thin film transistor may be further provided and is formed on the substrate.

In a certain preferred embodiment, the thin film transistor has a third semiconductor layer, and the third semiconductor layer is formed from the same amorphous semiconductor film as at least one layer among the first semiconductor layer and the second semiconductor layer.

In a certain preferred embodiment, the second semiconductor layer and the third semiconductor layer are crystalline semiconductor layers formed by crystallization of the same amorphous semiconductor film, and the first semiconductor layer is an amorphous semiconductor film formed from an amorphous semiconductor film that is different from the aforementioned same amorphous semiconductor film.

The first semiconductor layer, second semiconductor layer, and the third semiconductor layer may be formed from the aforementioned same amorphous semiconductor film.

The first semiconductor layer has a stacked structure including a p-type semiconductor film, an n-type semiconductor film, and a substantially intrinsic semiconductor film disposed between the p-type semiconductor film and the n-type semiconductor film, and the second semiconductor layer may include at least a p-type region and an n-type region.

The first semiconductor layer and the second semiconductor layer each may include at least a p-type region and a n-type region.

In a certain preferred embodiment, the semiconductor device further includes a plurality of photoreception parts arrayed two dimensionally, each photoreception part including the above-mentioned optical sensor unit; and the semiconductor device further includes an image information generation unit for generation of image data relating to the position of each of the photoreception parts and the sensing signal generated by the optical sensor unit of each the photoreception parts.

In a certain preferred embodiment, the semiconductor device is provided with a plurality of two dimensionally arrayed display units, and an optical sensor unit is disposed for each display unit or for a set comprising two or more display units.

Another semiconductor device of the present invention includes: a substrate and an optical sensor unit for sensing light, the optical sensor unit being formed on the substrate and including a first thin film diode having an amorphous semiconductor layer, and a second thin film diode having a crystalline semiconductor layer; wherein the first thin film diode and the second thin film diode are connected together in parallel and a sensing signal is generated based on output of either the first thin film diode or the second thin film diode.

A display device of the present invention includes: a display region having a plurality of display units; a plurality of optical sensor units provided in the display region for detecting respective light and for generating respective sensing signals, wherein each display unit has an electrode and a thin film transistor connected to the electrode, each of the optical sensor units being an optical sensor unit for sensing of light and generating a sensing signal, each of the optical sensor units comprising: a first thin film diode for sensing light of a first wavelength range, and a second thin film diode for sensing light of a second wavelength range including a wavelength longer than the maximum wavelength of the first wavelength range, the first thin film diode, the second thin film diode, and the thin film transistor being formed on the same substrate, the first thin film diode and the second thin film diode being connected together in parallel, and the signaling signal being generated based on output from either the first thin film diode or the second thin film diode.

In a certain preferred embodiment, the display device further includes a backlight for emission of visible light and infrared light, and the second thin film diode is capable of sensing the infrared light.

In a certain preferred embodiment, each of the optical sensor units is disposed in the display region corresponding to each display unit or to a set comprising two or more display units.

A method for manufacturing a semiconductor device of the present invention is a method for the manufacture of a semiconductor device that includes a substrate, an optical sensor unit formed on the substrate that includes a first thin film diode and a second thin film diode, and a thin film transistor formed on the substrate, the method including: (a) a step of forming an amorphous semiconductor film on the substrate; (b) a step of using the amorphous semiconductor film to form a second island-shape semiconductor layer forming an active region of the second thin film diode, and to form a third island-shape semiconductor layer forming an active region of the thin film transistor; and (c) a step of forming on the substrate a first island-shape semiconductor layer forming an active region of the first thin film diode, wherein the bandgap of the first island-shape semiconductor layer is larger than the bandgap of the second island-shape semiconductor layer.

In a certain preferred embodiment, the step (b) and the step (c) include a step of causing crystallization of part of the amorphous semiconductor film, and forming a semiconductor layer including a crystalline region and an amorphous region; and a step of patterning the semiconductor film, forming the second and third island-shape semiconductor layers from the crystalline region, and forming the first island-shape semiconductor layer from the amorphous region.

In a certain preferred embodiment, the step (a) forms the amorphous semiconductor film that is very thick in portions; the step (b) and the step (c) include a step of forming a semiconductor film including a crystalline region and an amorphous region by leaving the highly thick part of the amorphous semiconductor film amorphous, and by causing partial crystallization in the other region; and a step of patterning the semiconductor film to form the second and third island-shape semiconductor layers from the crystalline region, and to form the first island-shape semiconductor layer from the amorphous region.

In a certain preferred embodiment, the step (b) includes a step of causing crystallization of the amorphous semiconductor film to form a crystalline semiconductor film, and a step of patterning the crystalline semiconductor film to form the second and third island-shape semiconductor layers and the step (c) is performed after the step (b); and the first island-shape semiconductor layer is an amorphous semiconductor layer.

In a certain preferred embodiment, the manufacturing method further includes, after the step (b) and prior to the step (c), a step of forming on the second island-shape semiconductor layer a conductive layer electrically contacting the second island-shape semiconductor layer; and during the step (c), the first island-shape semiconductor layer has a stacked structure including, in order: an amorphous semiconductor layer of first conduction type formed on the electrical conduction layer; a substantially intrinsic amorphous semiconductor layer; and an amorphous semiconductor layer of second conduction type different from the first conduction type.

Effects of the Invention

According to the present invention, a semiconductor device equipped with an optical sensor unit is able to sense light over a wider wavelength range, and sensitivity of sensing can be increased. Especially when an amorphous layer is used as the active region of the first thin film diode of the optical sensor unit, and when a crystalline semiconductor layer is used as the active region of the second thin film diode, it is possible to increase sensing sensitivity over a wavelength range from the infrared to visible light.

The present invention is preferably used for a display device equipped with a touch sensor or image sensor function. By such a configuration, sensing performance can be realized that is independent of the display image and independent on the environment of use of the display device.

The semiconductor device of the present invention may include a thin film transistor formed on the same substrate as that of the above described optical sensor unit. In this case, among the first and second thin film diodes of the optical sensor unit, when at least one of the thin film diodes is formed from the same semiconductor film as that of the thin film transistor, it is possible to further simplify production without causing an increase in the number of manufacturing steps or in the cost of manufacture, and it is possible to realize product miniaturization, high product performance, and low product cost.

DETAILED DESCRIPTION OF EMBODIMENTS

The semiconductor device of the present invention is equipped with an optical sensor unit that includes a first thin film diode for sensing light of a first wavelength range and a second thin film diode for sensing light of a second wavelength range. The second wavelength range includes a wavelength longer than the maximum wavelength of the first wavelength range. Moreover, the first thin film diode and the second thin film diode are connected together in parallel, and a sensing signal is generated based on output of one of the first thin film diode and the second thin film diode.

A structure of an optical sensor unit of the present invention will be explained below more specifically with reference to figures.

Figure 1:
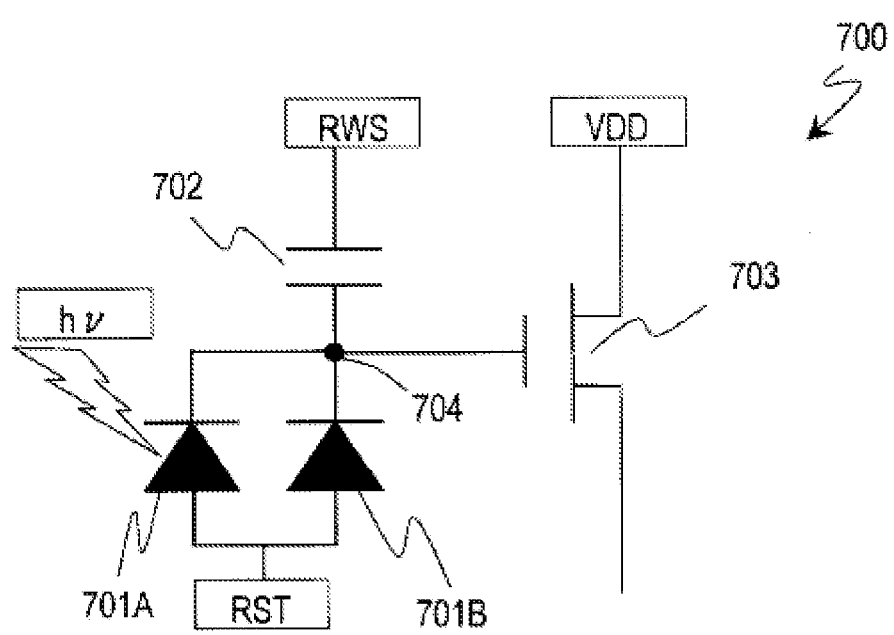
FIG. 1 is a circuit diagram showing an example structure of the optical sensor unit of an embodiment of the present invention.

FIG. 1 is a circuit diagram showing an example of an optical sensor unit of an embodiment of the present invention. The optical sensor unit 700 has an optical sensor thin film diode 701A and an optical sensor thin film diode 701B, which are connected in parallel, and also has a capacitor 702 used for signal retention. The wavelength range of light capable of being sensed by the thin film diode 701B includes a wavelength longer than the maximum wavelength that the thin film diode 701A is capable of sensing. The optical sensor unit 700 is connected to the signal extraction thin film transistor 703 in order to extract the signal that has accumulated in the capacitor 702 used for signal retention.

At the optical sensor unit 700, the RST signal is input to the thin film diodes 701A and 701B, which are connected together in parallel, and the RST potential is written to the node 704. Thereafter, when light is absorbed by at least one thin film diode among the thin film diodes 701A and 701B, the potential of the node 704 is lowered due to the photo leakage current. When the potential of the node 704 is lowered, the gate potential of the signal extraction thin film transistor 703 connected to the node 704 changes, and the gate of the thin film transistor 703 opens or closes. The signal VDD (also called the "sensing signal") can be read out by this means.

According to the above described optical sensor unit 700, a plurality of thin film diodes 701A and 701B, which have different wavelength ranges where sensing is possible, are connected in parallel. Therefore among the thin film diodes 701A and 701B, sensing can be carried out based on the output of the thin film diode that senses the light that is sensed, or sensing can be carried out based on the output of the thin film diode that senses the light with the higher sensitivity (i.e., the thin film diode with the largest photo leakage current). Therefore, the optical sensor unit 700 is capable of sensing all light capable of being sensed by at least one of the thin film diodes 701A and 701B, and therefore the wavelength range capable of being sensed can be greatly expanded. Moreover, among the thin film diodes 701A and 701B, sensing is carried out using the thin film diode that has the higher sensitivity with respect to the light being sensed, and accordingly, it becomes possible to increase sensitivity beyond that of the conventional technology. For example, when a TFD using an amorphous silicon layer is used as the thin film diode 701A, and when a TFD using a crystalline silicon layer is used as the thin film diode 701B, light in the visible region is sensed by the thin film diode 701A, and light in the infrared region, which cannot be sensed by the thin film diode 701A, can be sensed by the thin film diode 701B.

In contrast, the conventional optical sensor unit described above with reference to FIG. 17 only includes one type of optical sensor thin film diode 1701, and thus, light can only be sensed in the wavelength range capable of being sensed by this thin film diode 1701. For example, if a TFD using an amorphous silicon layer is used as the thin film diode 1701, sensing with high sensitivity is possible in visible light, but sensing of infrared light is virtually impossible.

Figure 17:
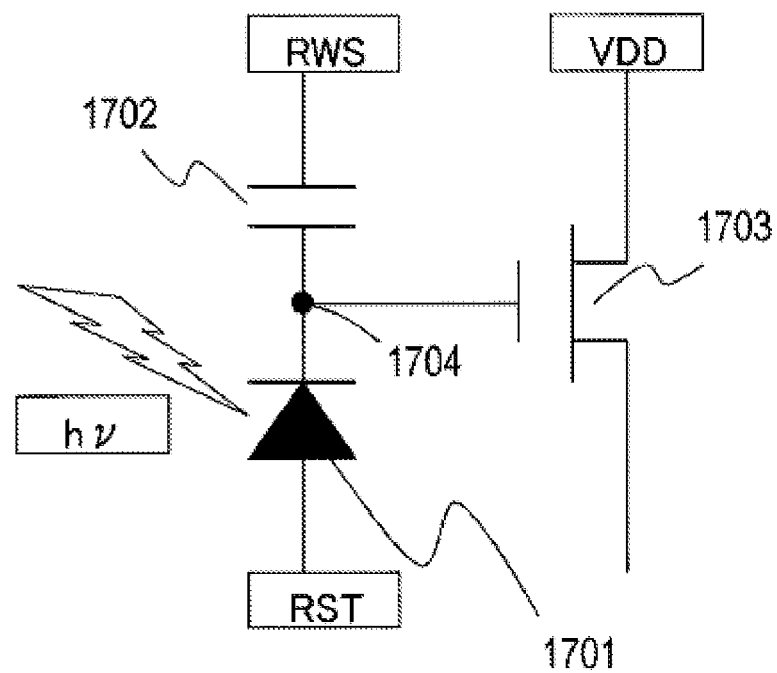
FIG. 17 is a circuit diagram showing the structure of a conventional optical sensor unit.

Moreover, the optical sensor unit 700 of the present embodiment has the following advantages in comparison to the conventional optical sensor unit shown in FIG. 17.

Using the optical sensor unit 700 shown in FIG. 1, after the sensing signal is output, by writing of the RST signal to the signal retention capacitor 702 by the forward electrical current of the thin film diode 701A and 701B, the potential of the capacitor 702 used for signal retention is reset. At this time, the forward electrical current flows through the thin film diode that has the higher current driving force among the thin film diodes 701A and 701B (i.e., the thin film diode that has the greater forward electrical current). For example, when the crystalline states of the semiconductor layers of the thin film diodes 701A and 701B are mutually different, electrical current flows through the thin film diode that uses the semiconductor layer that has a higher degree of crystallinity. More specifically, when the thin film diode 701A is formed using an amorphous silicon layer, and when the thin film diode 701B is formed using an crystalline silicon layer, then the forward electrical current flows through the thin film diode 701B, which uses the crystalline silicon layer. Therefore, there is no need for providing a separate TFT for resetting. As a result, the circuit structure can be simplified, and yield can be improved. Moreover, when the optical sensor unit 700 is provided within the display region of a display device, the aperture ratio of the display device can be improved, and it is possible to attain a brighter display.

In contrast, for the conventional optical sensor unit shown in FIG. 17, due to the structure of the thin film diode 1701, which uses an amorphous semiconductor layer such as an amorphous silicon layer or the like, and due to the low electrical current drive of the amorphous semiconductor layer, sufficient forward electrical current cannot flow through the thin film diode 1701. Thus the optical unit must be separately provided with a TFT for resetting (not illustrated).

In this manner, the wavelength ranges capable of being sensed by the thin film diodes 701A and 701B can be mutually complementary for the optical sensor unit 700. That is to say, the sensing signal can be generated on the basis of the output of the single thin film diode that is capable of sensing the sensing light (i.e., light subject to sensing), or on the basis of the output of the thin film diode that is capable of sensing the sensing light with higher sensitivity. Moreover, resetting processing can be performed by the flow of forward electrical current through the thin film diode that has the higher electrical current drive force among the thin film diodes 701A and 701B.

As described above, when the wavelength range capable of being sensed by the thin film diode 701A is referred to as "first wavelength range," and the wavelength range capable of being sensed by the thin film diode 701B is referred to as "second wavelength range", the second wavelength range includes a wavelength that is longer than the maximum wavelength of the first wavelength range. In other words, the maximum wavelength of the second wavelength range is longer than the maximum wavelength of the first wavelength range. Therefore, a sensing signal can be generated based on output of the second thin film diode 701B with respect to light of a wavelength that is longer than the maximum wavelength of the first wavelength range. Moreover, for light in a wavelength range where the first and second wavelength ranges overlap, among the two thin film diodes 701A and 701B, it is possible to generate a sensing signal based on the output of the thin film diode that has the higher sensitivity for such light. It is possible to generate the sensing signal based on output of the first thin film diode 701A with respect to light that is shorter than the shortest wavelength of the second wavelength range and that belongs to the first wavelength range.

Furthermore, the first wavelength range and the second wavelength range preferably partially overlap. If these regions do not overlap, then the regions capable of being sensed by the optical sensor unit may become discontinuous. Moreover, as long as the second wavelength range includes a wavelength greater than the maximum wavelength of the first wavelength range, the minimum wavelength of the second wavelength range may be shorter than the shortest wavelength of the first wavelength range.

The second thin film diode 701B preferably is capable of sensing infrared radiation. Moreover the first thin film diode 701A preferably has a sensitivity that is higher than that of the second thin film diode 701B with respect to visible light. By this means, good sensing performance can be realized over a wavelength range from infrared light to visible light.

The first thin film diode 701A and the second thin film diode 701B may be formed using semiconductor layers that have mutually different crystallization states. For example, although an amorphous semiconductor film displays high sensitivity in the visible light region, sensitivity becomes nearly zero in the infrared region. Conversely, a crystalline semiconductor film has only low sensitivity in the visible light region in comparison to the amorphous semiconductor film, but is capable of sensing infrared radiation. Therefore, by forming the first thin film diode 701A using an amorphous semiconductor layer, and by forming the second thin film diode 701B using a crystalline semiconductor layer, it is possible to perform sensing over a wavelength range from infrared light to visible light.

The above described optical sensing unit 700 is a preferred sensing unit for use in a display device. In particular, by providing the above described optical sensing unit 700 within the display region of a display device, it is possible to impart a touch sensor or image sensor function to the display device. The display device is preferably equipped with a backlight for emission of infrared light in addition to visible light. By such provision, it becomes possible to jointly use the method that performs sensing using ambient light and the method that performs sensing using infrared light emitted from the backlight. It is therefore possible to perform sensing at high sensitivity without dependence on the displayed image or the environment of use of the display device.

Embodiment 1

Embodiment 1 of the semiconductor device of the present invention will be explained below with reference to the figures. The semiconductor device of the present embodiment is provided with an n-channel type TFT and two types of optical sensor TFDs formed on the same substrate. The two types of optical sensor TFDs are connected together in parallel and constitute an optical sensor unit. The present embodiment can be used as an active matrix type display device that has a sensor function, for example, such as a touch sensor, image sensor, or the like.

In the present embodiment, the structure of the optical sensor unit is the same as the structure that was described previously with reference to FIG. 1. Moreover, the n-channel type TFT may be a signal read-out TFT used by the optical sensor unit, or may be a TFT used for pixel switching, or may be a TFT used by the drive circuit.

Figure 2:
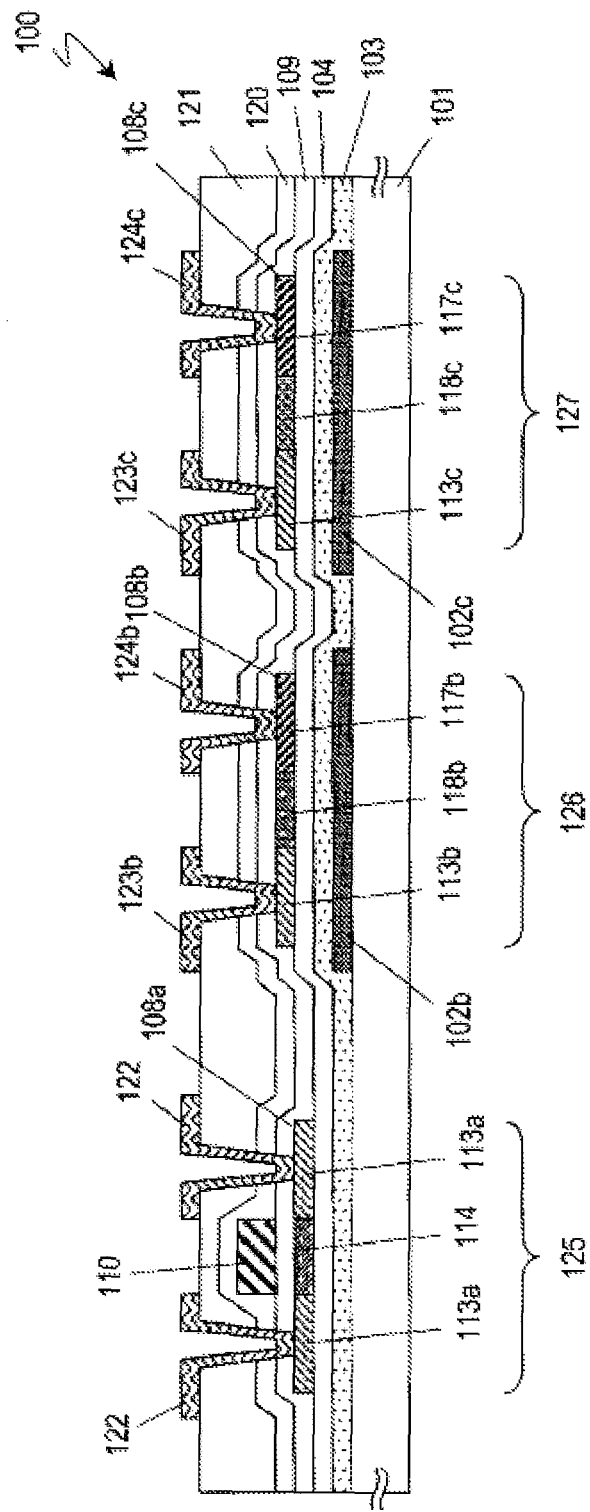
FIG. 2 is a schematic cross-sectional drawing showing a semiconductor device of Embodiment 1 of the present invention.

FIG. 2 is a schematic cross-sectional drawing showing an example of the semiconductor device of the present embodiment. Although the semiconductor device of the present embodiment typically has a plurality of optical sensor units and a plurality of TFTs arranged on the same substrate, for the purpose of this drawing, the TFT and the two types of optical sensor TFD constituting the optical sensor unit are each illustrated as one component for the sake of simplicity. The TFT and each of the TFDs have a lateral structure.

The semiconductor device 100 of the present embodiment is equipped with a thin film transistor 125 and thin film diodes 126 and 127. The thin film transistor 125 and the thin film diodes 126 and 127 are formed on the substrate 101 through base films 103 and 104. Thin film diodes 126 and 127 are connected in parallel, although such connection is not shown in the figure.

The thin film transistor 125 has a semiconductor layer 108a including a channel region 114, a source region, and a drain region 113a, a gate insulation film 109 provided on top of the semiconductor layer 108a, a gate electrode 110 controlling the electrical conductivity of the channel region 114, and electrodes/lines 122 connected respectively to the source region and the drain region 113a. The thin film diode 126 has at least semiconductor layer 108b, which includes the n-type region 113b and the p-type region 117b, and electrodes/lines 123b and 124b, which are connected to the n-type region 113b and the p-type region 117b. Similarly, the thin film diode 127 has at least semiconductor layer 108c, which includes the n-type region 113c and the p-type region 117c, and electrodes-lines 123c and 124c, which are connected to the n-type region 113c and the p-type region 117c. In the illustrated example, intrinsic regions 118b and 118c are respectively provided between the n-type regions 113b and 113c and the p-type regions 117b and 117c on semiconductor layers 108b and 108c.

In the present embodiment, the semiconductor layer 108a of the thin film transistor 125 and the semiconductor layer 108b of the thin film diode 126 are crystalline semiconductor layers (e.g., crystalline silicon layers). The semiconductor layer 108c of the thin film diode 127 is an amorphous semiconductor layer (e.g., an amorphous silicon layer). As described below, the wavelength capable of being sensed by the thin film diode 126 includes a wavelength that is longer than the maximum wavelength capable of being sensed by the thin film electrode 127. Therefore the thin film diode 127 corresponds to the thin film diode 701A shown in FIG. 1, and the thin film diode 126 corresponds to the thin film diode 701B shown in FIG. 1.

A silicon nitride film 120 and a silicon oxide film 121 are formed above thin film transistor 125 and thin film diodes 126 and 127 as interlayer insulation films. Moreover, when a transparent substrate is used as the substrate 101, light shielding layers 102b and 102c are preferably provided between semiconductor layers 108b and 108c and substrate 101 in order to prevent the entry of light from the back surface of the substrate 101 into the semiconductor layers 108b and 108c, respectively.

The regions of light capable of being sensed by the thin film diodes 126 and 127 differ according to the types of semiconductor layers 108b and 108c forming the active regions. Specifically, these regions are determined by the bandgaps of the semiconductor layers 108b and 108c.

The wavelength range capable of being sensed by optical sensor TFDs (thin film diodes 126 and 127) of the present embodiment will be explained below with reference to the figures.

Figure 3:
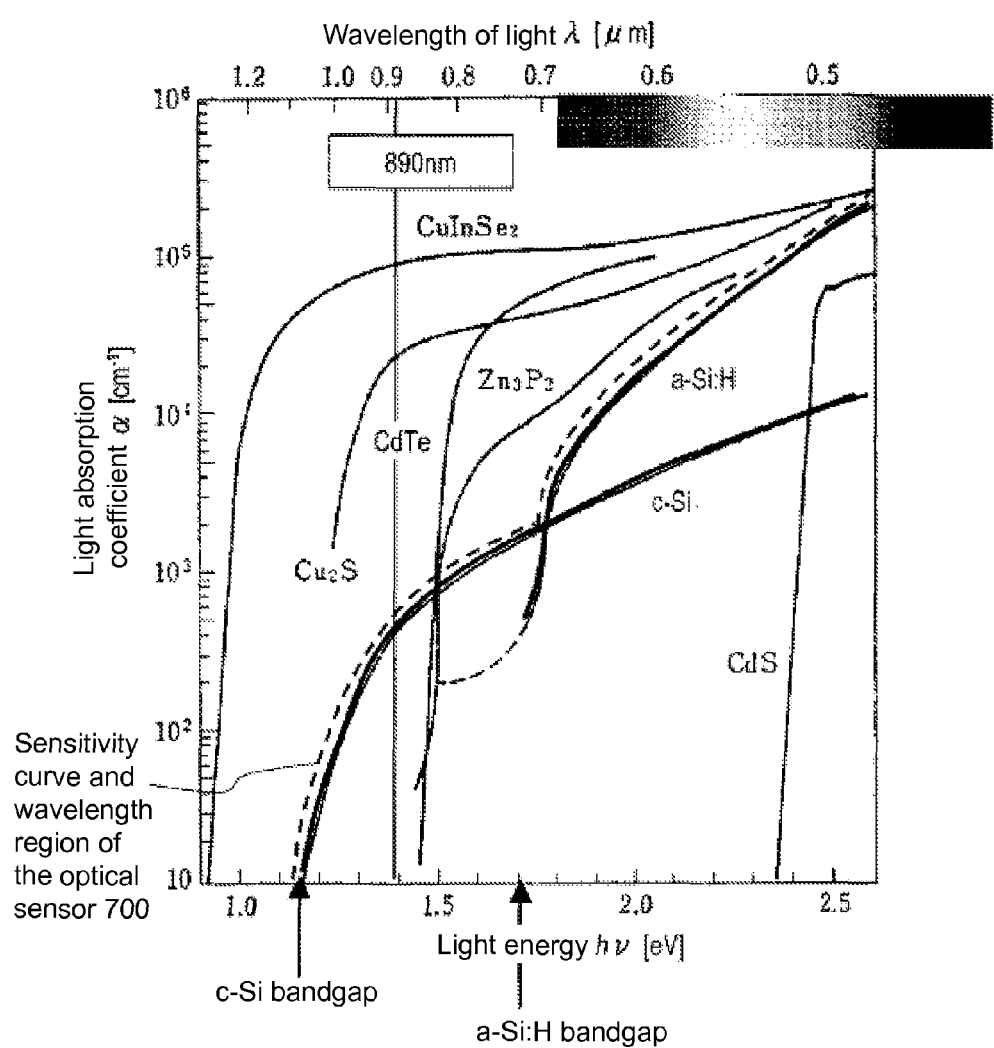
FIG. 3 is a graph showing wavelength dependency of the light absorption coefficient for various types of semiconductors.

FIG. 3 is a graph showing wavelength dependence of the light absorption coefficient for various types of semiconductor films. The horizontal axis indicates light energy and the corresponding wavelength of light. The vertical axis indicates the light absorption coefficient. Sensitivity for light at a given wavelength increases as the magnitude of the light absorption coefficient increases.

As understood from FIG. 3, for each semiconductor film, absorption of light is possible for light at wavelengths less than or equal to the wavelength corresponding to the bandgap of the semiconductor film. Moreover, sensitivity tends to increase as the wavelength of light becomes shorter.

For the thin film diode 126 in the present embodiment, a crystalline silicon (c-Si) layer is used as the semiconductor layer 108b. As shown in FIG. 3, the bandgap of c-Si is 1.15 eV, and thus, the c-Si layer is able to absorb light at wavelengths less than or equal to the wavelength (1.05 μm) corresponding to this bandgap. Therefore, in addition to visible light, the thin film diode 126 is able to sufficiently sense infrared light (i.e., at wavelengths greater than or equal to 0.7 μm and energies less than or equal to 1.7 eV). If an infrared backlight is used, it is possible to perform sensing using infrared light at a wavelength of 0.89 μm, for example.

On the other hand, for thin film diode 127, an amorphous silicon (a-Si) layer is used as the semiconductor layer 108c. Since the bandgap of a-Si is 1.7 eV, the a-Si layer is able to absorb light at wavelengths less than or equal to the wavelength (0.7 μm) corresponding to this bandgap. As apparent from FIG. 3, in the visible light region, sensitivity of the a-Si layer becomes higher than sensitivity of the c-Si layer. However, sensitivity becomes nearly zero for the a-Si layer with respect to infrared light or like light, where the wavelength is longer than 0.7 μm.

Therefore, by use of the optical sensor unit of the present embodiment, sensing in possible for infrared light using the thin film diode 126 with the c-Si layer, and sensing is possible for visible light using the thin film diode 127 with the a-Si layer. As a result, increased sensitivity is possible over a wide wavelength range that includes infrared light and visible light.

Furthermore, the crystalline states or materials of the semiconductor layer 108b of the thin film diode 126 and the semiconductor layer 108c of the thin film diode 127 may be selected so that the wavelength ranges capable of being sensed by these optical sensor TFDs are mutually different. Instead of the a-Si layer and c-Si layer indicated above, for example, it is possible to use another semiconductor material as indicated in FIG. 3. The materials of the semiconductor layers 108b and 108c may be mutually different. Alternatively, the semiconductor layer 108b and the semiconductor layer 108c may include the same material, and the crystalline states may be mutually different. In this case, the semiconductor layers 108b and 108c may both be crystalline semiconductor layers, or alternatively, one of the semiconductor layers may be a crystalline semiconductor layer while the other semiconductor layer may be an amorphous semiconductor layer. When the semiconductor layers 108b and 108c contain the same material, as described below, forming these semiconductor layers from the same semiconductor film is advantageous due to the ability to simplify the production process.

Although no particular limitation is placed on the material and the crystalline state of the semiconductor layer 108a of the thin film transistor 125, use of a crystalline semiconductor layer as the semiconductor layer 108a is preferred for obtaining good transistor characteristics. Moreover, formation of the semiconductor layer 108a of the thin film transistor 125 using the same semiconductor film as at least one of the semiconductor layers 108b of the first optical sensor TFD and the semiconductor layer 108c of the second optical sensor TFD is preferred due the ability to simplify the production process.

FIG. 2 shows an example of an n-channel type TFT, which has a (normal) single drain structure, as the thin film transistor 125. However, an LDD structure or GOLD structure TFT may also be used. The semiconductor device of the present embodiment may also be equipped with multiple TFTs including n-channel type TFTs and p-channel type TFTs.

Although FIG. 2 shows an example of lateral-structured TFDs as the thin film diodes 126 and 127, either or both of these thin film diodes 126 and 127 may use a stacked structure. The term "lateral structure" here means a structure that includes a semiconductor layer including an n-type semiconductor layer and a p-type semiconductor layer in which the electrical current flows in the lateral direction within the semiconductor layer. The term "stacked structure" means a stacked structure that includes an n-type semiconductor layer and a p-type semiconductor layer in which the electrical current flows in the vertical direction through the stacked structure.

The structure of the optical sensor unit 700 is not limited to the structure shown in FIG. 1. For example, three or more types of optical sensor TFDs, each capable of sensing a different wavelength, may be connected together in parallel. Alternatively, a single optical sensor unit 700 may include two types of optical sensor TFDs with optical sensor TFDs of each type being present in plurality. In this case, the output may be increased by parallel connection of optical sensor TFDs of the same type.

The present embodiment is a preferred embodiment for use in an active matrix type liquid crystal display device. In this case, an optical sensor unit 700 (FIG. 1) may be disposed in the display region of the liquid crystal display device at each pixel or at each set constituted by multiple pixels. The optical sensor unit 700 of the present embodiment is constructed so as to be capable of sensing infrared light, rather than being limited to sensing just visible light. Therefore, in addition to being able to perform sensing at high sensitivity using ambient light, it becomes possible to perform sensing using infrared light when ambient light cannot be sufficiently used. The thin film transistor 125 may be used as a switching element and may be provided for each pixel of the liquid crystal display device, or may be used for a drive circuit arranged at a region outside the display region (i.e., at the screen edge region). Alternatively, the thin film transistor 125 may be the signal extraction thin film transistor 703 shown in the circuit in FIG. 1.

A method for manufacturing the semiconductor device of the present embodiment will be described next with reference to the figures. Here, an example will be explained for the case of forming the semiconductor device using the same amorphous semiconductor film for the thin semiconductor layers 108a, 108b and 108c of the transistor 125 and the thin film diodes 126 and 127.

Figure 4:
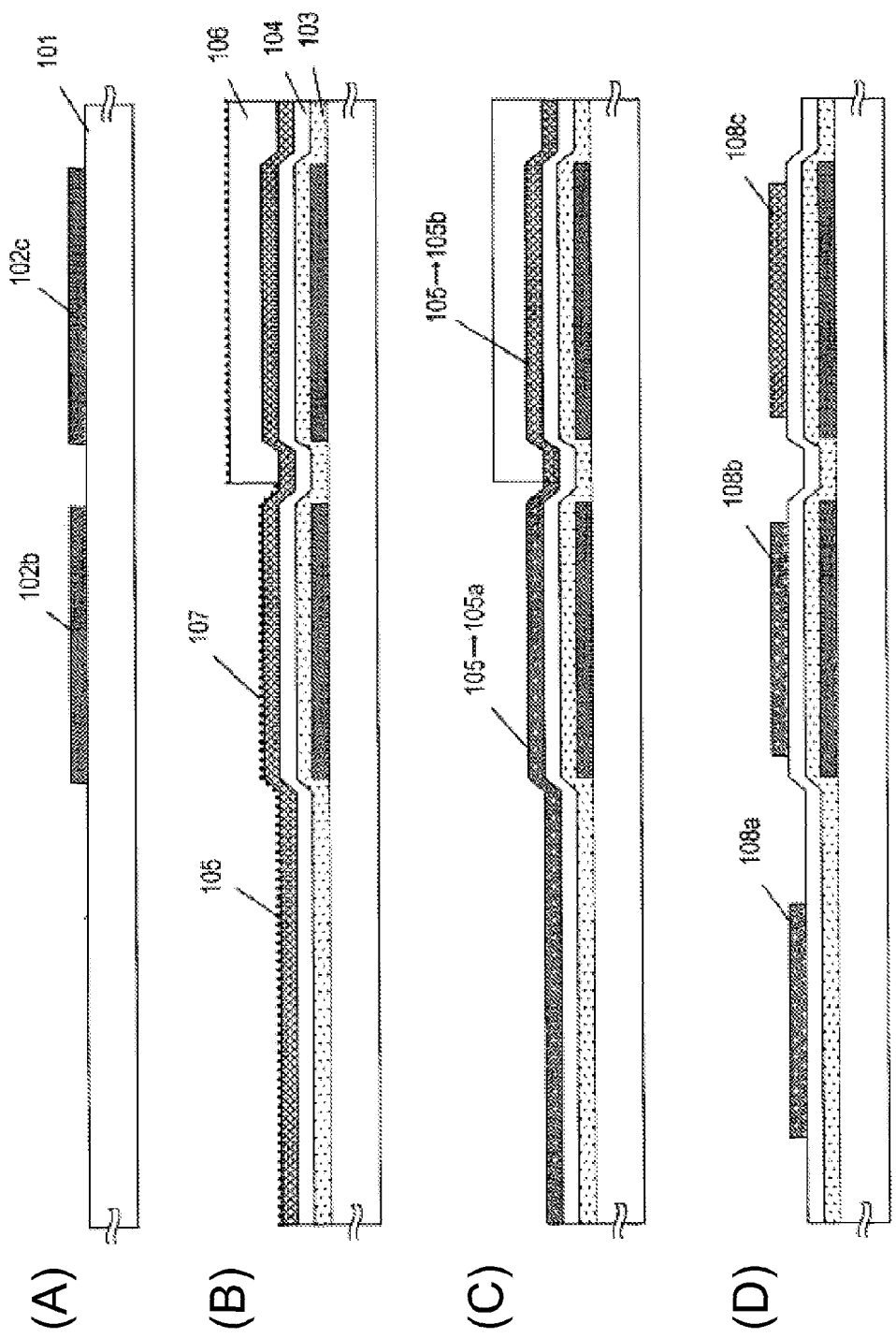
FIGS. 4 (A) through (D) are schematic cross-sectional drawings showing a manufacture process of the semiconductor device Embodiment 1 of the present invention.

First, as shown in FIG. 4 (A), light shielding layers 102b and 102c are formed on the substrate 101. A low alkali glass substrate or a quartz substrate can be used as the substrate 101. A low alkali glass substrate is used in the present embodiment, and this low alkali glass may be heat treated beforehand at a temperature of about 10° C. to 20° C. below the glass strain point.

The light shielding layers 102b and 102c are positioned so as to be capable of blocking light from reaching the TFDs from the substrate back surface direction. A metal film, silicon film, or the like, can be used as the material for the light shielding layers 102b and 102c. When a metal film is used, taking into account the heat treatment performed later during the manufacture, the metal should preferably be a metal with a high melting point, such as tantalum (Ta), tungsten (W), molybdenum (Mo), or the like. The light shielding layers 102b and 102c in the present embodiment are formed by deposition of a Mo film by sputtering and then patterning the deposited film. The thickness of the light shielding layers 102b and 102c must be set for sufficient shielding against infrared light as well as visible light. For example, this thickness is 50 to 300 nm, and preferably is 100 to 200 nm. In the present embodiment, for example, this thickness is 130 nm.

Thereafter, as shown in FIG. 4 (B), a silicon nitride film 103 and a silicon oxide film 104 are formed as base films on the substrate 101 and the light shielding layers 102b and 102c. Then, an amorphous film (referred to here as an "a-Si film") 105 is formed. Next, a mask film 106 (e.g., a silicon oxide film) is formed covering part of the a-Si film 105, and a trace amount of a catalyst element (nickel in this case) is added from above the mask film 106. The catalyst element is added to the part of the a-Si film 105 that is not covered by the mask film 106 to form a catalyst element doped region 107.

The silicon nitride film 103 and the silicon oxide film 104 are provided to prevent diffusion of impurities from the substrate 101. The plasma CVD method is used for formation of these base films 103 and 104 in the present embodiment. Total thickness of these base films 103 and 104 is 100 to 600 nm, and preferably is 150 to 450 nm. Although a two-layer base film was used in the present embodiment, alternatively, a single layer of silicon oxide film may also be used, for example.

Formation of the a-Si film 105 is performed by a widely known method such as the plasma CVD method, sputtering method, or the like. The thickness of the a-Si film 105 is set to be greater than or equal to 20 nm and less than or equal to 150 nm, and preferably is set to be greater than or equal to 30 nm and less than or equal to 80 nm. In the present embodiment, the plasma CVD method is used to form a 50 nm thick a-Si film. Since the base films 103 and 104 and the a-Si film 105 can be formed by the same film deposition method, the base films 103 and 104 and the a-Si film 105 may be formed continuously. Because the substrate is not exposed to the atmosphere after formation of the base films 103 and 104, it is possible to prevent surface contamination, and it becomes possible to decrease characteristic variances and changes in the threshold voltage of the produced TFT.

The mask film 106 can be formed by forming a 50 to 400 nm thickness (e.g., 200 nm) silicon oxide film and then by forming an aperture in part of the silicon oxide film by patterning. A silicon nitride film may be used in place of the silicon oxide film.

The addition of the catalyst element is performed, for example, by spin coating of an aqueous solution (e.g., nickel acetate aqueous solution) containing 5 ppm of the catalyst element (nickel). Rather than using nickel (Ni) as the catalyst element, it is also possible to use one type or multiple types of elements selected from the group including iron (Fe), cobalt (Co), tin (Sn), lead (Pb), palladium (Pd), and copper (Cu). Moreover, ruthenium (Ru), rhodium (Rh), osmium (Os), iridium (Ir), platinum (Pt), gold (Au), or a similar suitable element can also function as the catalyst element, although these elements have less catalytic effects. The amount of the dopant catalyst element is very small, and the catalyst element concentration on the surface of the a-Si film 105 and the mask film 106 is evaluated by the total reflection X-ray fluorescence (TRXRF) method. In the present embodiment, the concentration is about $5 \times 10^{12}$ atoms/cm$^2$. Prior to this step, the surface of the a-Si film 105 may be slightly oxidized using ozone water or the like in order to improve the wettability of the surface of the a-Si film 105 during spin coating.

The catalyst element may be added by forming a thin film made of a catalyst element (nickel film in the present embodiment) on top of the a-Si film 105, by using the vapor deposition method, sputtering method, or the like, instead of using the spin coating method.

After this, heat treatment is carried out in an inert atmosphere (e.g., a nitrogen atmosphere) as shown in FIG. 4 (C), and a portion of the a-Si layer 105 is crystallized.

As the heat treatment, it is preferable to perform an annealing treatment at about 500° C. to 650° C. for approximately 30 minutes to 4 hours. In the present embodiment, the heat treatment is performed at a temperature of 600° C. for 1 hour. In the catalyst element doped region 107 in the a-Si film 105, the nickel diffuses into the a-Si film 105 while being silicified, and crystallization of the a-Si film 105 proceeds using the silicide as nuclei. As a result, the catalyst element doped region 107 crystallizes to form the crystallized region 105a. On the other hand, the region of the a-Si film 105 that was covered by the mask film 106 and was not doped by the catalyst element remains amorphous (amorphous region 105b). While the crystallization process is performed here by heat treatment using a furnace, crystallization may alternatively be performed using an RTA (Rapid Thermal Annealing) apparatus using a lamp or the like as a heat source.

After removal of the mask film 106, as shown in FIG. 4 (D), element separation is performed by removing unnecessary regions of the partially crystallized semiconductor film. In this manner, the crystallized region 105a is used as the semiconductor layer 108a for forming the active regions (source-drain regions and channel region) of the TFT and as the semiconductor layer 108b for forming the active regions (n$^+$ type/p$^+$ type region, intrinsic region) of an optical sensor TFD. The amorphous region 105b is used to form the semiconductor layer 108c that becomes the active region of the other optical sensor TFD.

Figure 5:
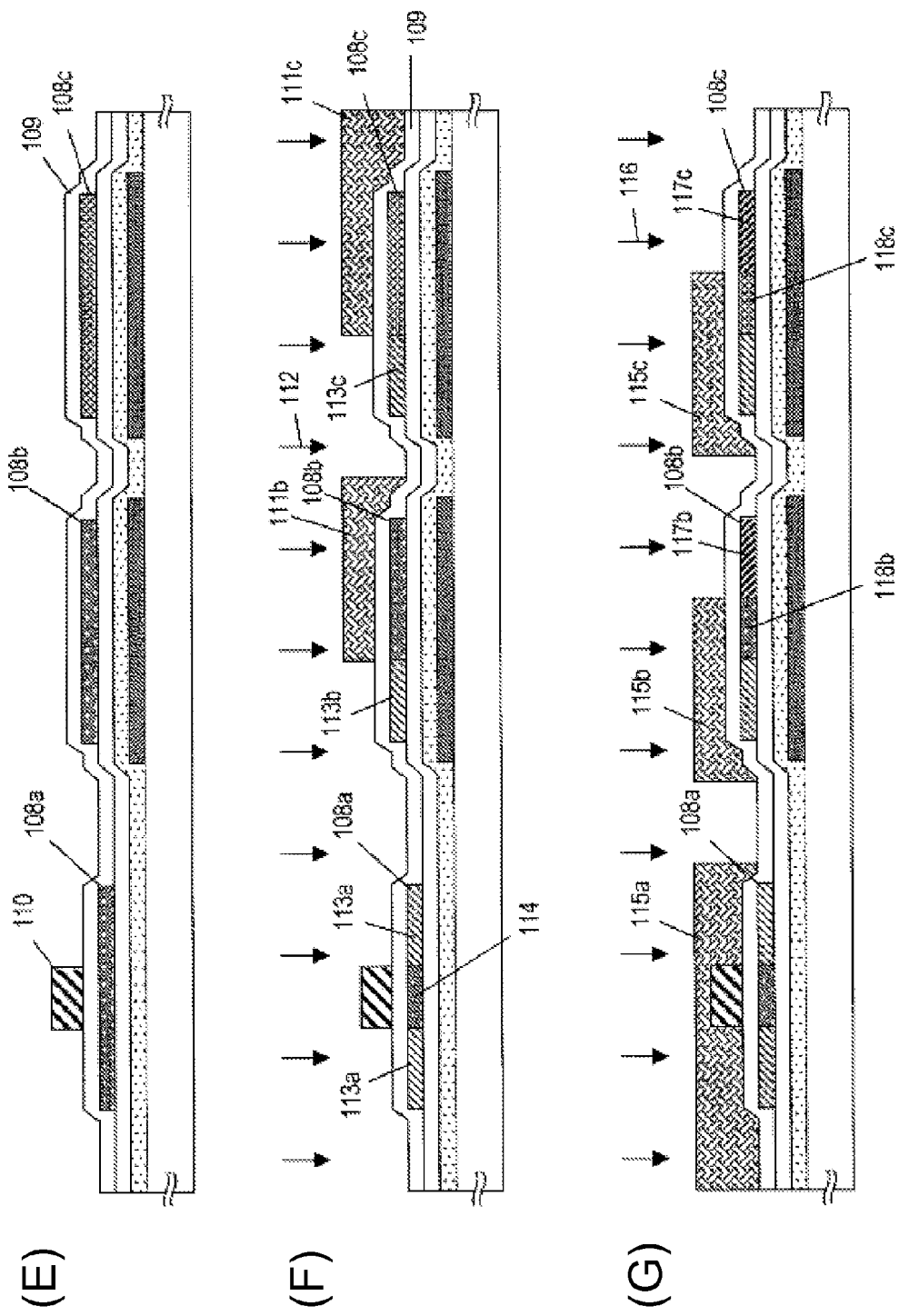
FIGS. 5 (E) through (G) are schematic cross-sectional drawings showing a manufacture process of the semiconductor device of Embodiment 1 of the present invention.

Next, as shown in FIG. 5 (E), after formation of a gate insulation film 109 covering the semiconductor layers 108a through 108c, a gate electrode 110 is formed on the gate insulation film 109 so as to overlap part of the TFT semiconductor layer 108a.

A silicon oxide film of 20 to 150 nm thickness is preferably used as the gate insulation film 109, and a 100 nm thick silicon oxide film is used in the present embodiment. The gate electrode 110 is formed by deposition of an electrically conductive film on the gate insulation film 109 using the sputtering method, CVD method, or the like, and then patterning the deposited electrically conductive film. The electrically conductive film is preferably a metal having a high melting point, such as W, Ta, Ti, Mo, or an alloy thereof. The thickness of the electrically conductive film is preferably 300 to 600 nm. In the present embodiment, tantalum (450 nm thick) containing a small amount of nitrogen is used as the electrically conductive film.

Next, as shown in FIG. 5 (F), masks 111b and 111c are formed of a photoresist to cover part of the semiconductor films 108b and 108c, respectively. In this state, an n-type impurity (phosphorus) 112 is used to dope the semiconductor layers 108a through 108c from above the substrate 101. The phosphorus 112 passes through the gate insulation film 109 and is implanted into the semiconductor layers 108a through 108c. Therefore, the region of the semiconductor layer 108a where phosphorus 112 was implanted becomes the TFT source region and drain region 113a, and the region of the semiconductor layer 108a that was masked by the gate electrode 110 and that was not implanted by phosphorus 112 becomes the channel region 114 of the TFT. Moreover, the region within the semiconductor layer 108b that was implanted with phosphorus 112 becomes the n$^+$ type region 113b of the TFD. Similarly, the region within the semiconductor layer 108c that was implanted by phosphorus 112 becomes the n type region 113c of the TFD.

After removal of the masks 111b and 111c, as shown in FIG. 5 (G), masks 115a, 115b, and 115c are formed of a resist on the gate insulation film 109 so as to cover the entire semiconductor layer 108a that becomes the active region of the TFT and to cover parts of the semiconductor layers 108b and 108c that become the active regions of the TFDs. In this state, the entire surface is subjected to ion doping from above the substrate 101 using a p-type impurity (boron) 116. During this ion doping, the boron 116 passes through the gate insulation film 109 and is implanted into the semiconductor layers 108b and 108c. During this process, in the semiconductor layers 108b and 108c of the TFDs, boron 116 is implanted into regions not covered by the resist masks 115b and 115c, and these regions become p-type regions 117b and 117c of the TFDs, respectively. Regions within the semiconductor layers 108b and 108c where neither boron nor phosphorus were injected become the TFD intrinsic regions 118b and 118c, respectively.

After this, the masks 115a, 115b, and 115c are removed. Then, a heat treatment is performed in an inert atmosphere (e.g., in a nitrogen atmosphere). Due to this heat treatment, as shown in FIG. 6 (H), the source-drain regions 113a of the TFT and the n-type regions 113b and 113c and the p-type regions 117b and 117c of the TFDs are activated, and Ni gettering is performed.

Specifically, in the source-drain regions 113a and in the n-type regions 113b and 113c and the p-type regions 117b and 117c of the TFDs, doping damage that occurred during doping (e.g., crystal defects or the like) is restored, and the respectively doped phosphorus and boron are activated. At this time, Ni moves within the semiconductor layer 108a in the direction indicated by the arrow 119a from the channel region 114 toward the source-drain regions 113a. In the semiconductor layer 108b, Ni moves in the direction indicated by the arrow 119b from the intrinsic region 118b toward the n-type region 113b. By this means, concentration of Ni in the channel region 114 becomes lower than concentration of Ni in the source-drain regions 113a. Moreover, concentration of Ni in the intrinsic region 118b becomes lower than concentration of Ni in the n-type region 113b.

Although the heat treatment of the present step may be performed using a commonly used furnace, the heat treatment is preferably performed using RTA (Rapid Thermal Annealing). An especially suitable method blows a hot inert gas against the substrate surface and quickly raises and lowers the temperature.

Figure 6:
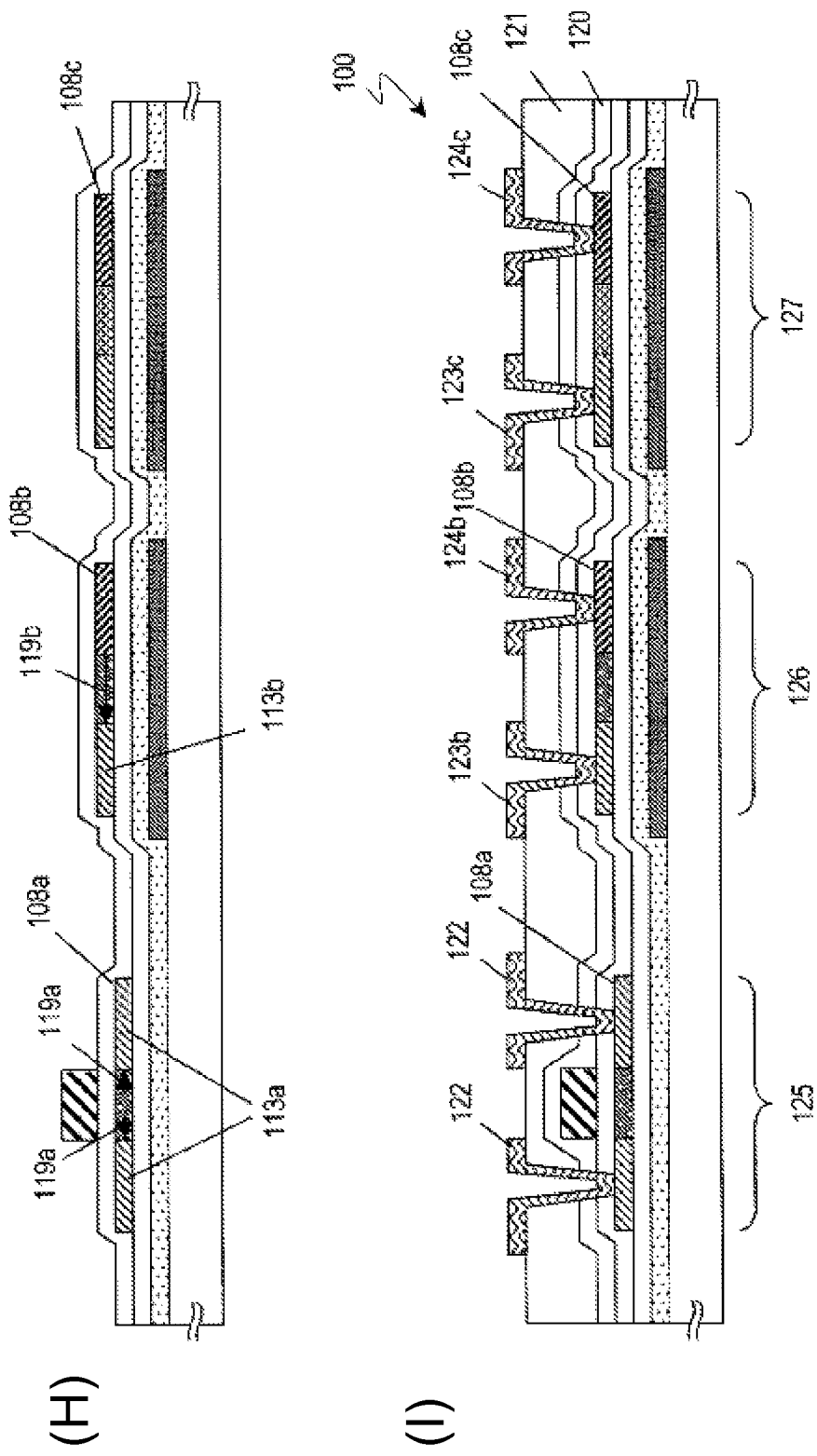
FIG. 6 (H) and (I) are schematic cross-sectional drawings showing a manufacture process of the semiconductor device of Embodiment 1 of the present invention.

Then, as shown in FIG. 6 (I), a silicon nitride film 120 and a silicon oxide film 121 are formed in that order as interlayer insulation films. If described, a heat treatment may be performed for hydrogenation of the semiconductor layers 108a to 108c. Such heat treatment may be performed by annealing at 350 to 450° C. in a nitrogen atmosphere or a hydrogen mixed atmosphere at 1 atmosphere pressure, for example. The dangling bonds of the semiconductor layers 108a through 108c can be hydrogen-terminated and deactivated by this means. After this, contact holes are formed in the interlayer insulation films 120 and 121. And then, a film formed of a metal material (e.g., a double layered film of titanium nitride and aluminum) is deposited on the interlayer insulation film 121 and within the contact holes, and then patterning is performed to form the TFT electrode-line 122 and the TFD electrodes-lines 123b, 123c, 124b, and 124c. The thin film transistor 125 and the thin film diodes 126 and 127 are obtained in this manner. In order to protect these components, a protective film formed of silicon nitride or the like may be provided on the thin film transistor 125 and the thin film diodes 126 and 127.

Although not shown in the figures, the electrode 123b contacting the n-type region 113b of the thin film diode 126 and the electrodes 123c contacting the n-type region 113c of the thin film diode 127 are connected in a plain view. In the same manner, the electrode 124b connected to the p-type region 117b and the electrode 124c connected to the p-type region 117c are mutually connected. Therefore, the thin film diodes 126 and 127 are connected in parallel.

According to the above described method, after selective crystallization of part of the amorphous semiconductor layer is performed, the semiconductor layer 108a that becomes the TFT active region, and the semiconductor layer 108b that becomes the active region of one of the optical sensor TFDs are formed of the crystallized region (crystalline region), and the semiconductor layer 108c that becomes the active region of the other optical sensor TDF is formed of the non-crystallized region (amorphous region). In this manner, by bringing about partial differences in the crystalline state while using the same amorphous semiconductor film, it is possible to separately produce the semiconductor layers 108a to 108c that become the active regions of the TFT and two types of TFDs. It is thus possible to efficiently form these three types of devices on the same substrate, and the manufacture process can be simplified.

Moreover, by addition of the catalyst element only to part of the amorphous semiconductor film, it is possible to separately produce crystalline regions and amorphous regions with good accuracy during the crystallization step that causes selective crystallization of the amorphous semiconductor film. It is also possible to increase crystallinity of the crystalline region.

Furthermore, both the two types of optical sensor TFDs (thin film diodes 126 and 127) and the TFT (thin film transistor 125) have lateral structures in the present embodiment. Therefore, the manufacture process can be further simplified because of the ability to simultaneously perform the doping step, the interlayer insulation film formation step, and the like during the manufacture of the TFT and optical sensor TFDs.

Embodiment 2

Embodiment 2 of the semiconductor device of the present invention will be explained below with reference to the figures. The semiconductor device of the present embodiment, similarly to the semiconductor device for Embodiment 1 (FIG. 2), is provided with a TFT and two types of optical sensor TFDs formed on the same substrate. The two types of optical sensor TFDs are connected together in parallel to constitute an optical sensor unit. The structure of the optical sensor unit of the present embodiment is similar to the structure that was explained previously with reference to FIG. 1.

In the present embodiment, one of the optical sensor TFDs has a lateral structure, and the semiconductor layer thereof is a crystalline semiconductor layer (e.g., c-Si layer) formed using the same semiconductor film as that of the semiconductor layer of the TFT. The other optical sensor TFD uses a source-drain electrode for the bottom electrode and has stacked layer semiconductor layers stacked as a P layer, I layer, and N layer (PIC). Among the stacked semiconductor layers, at least the I layer is an amorphous semiconductor layer.

Figure 7:
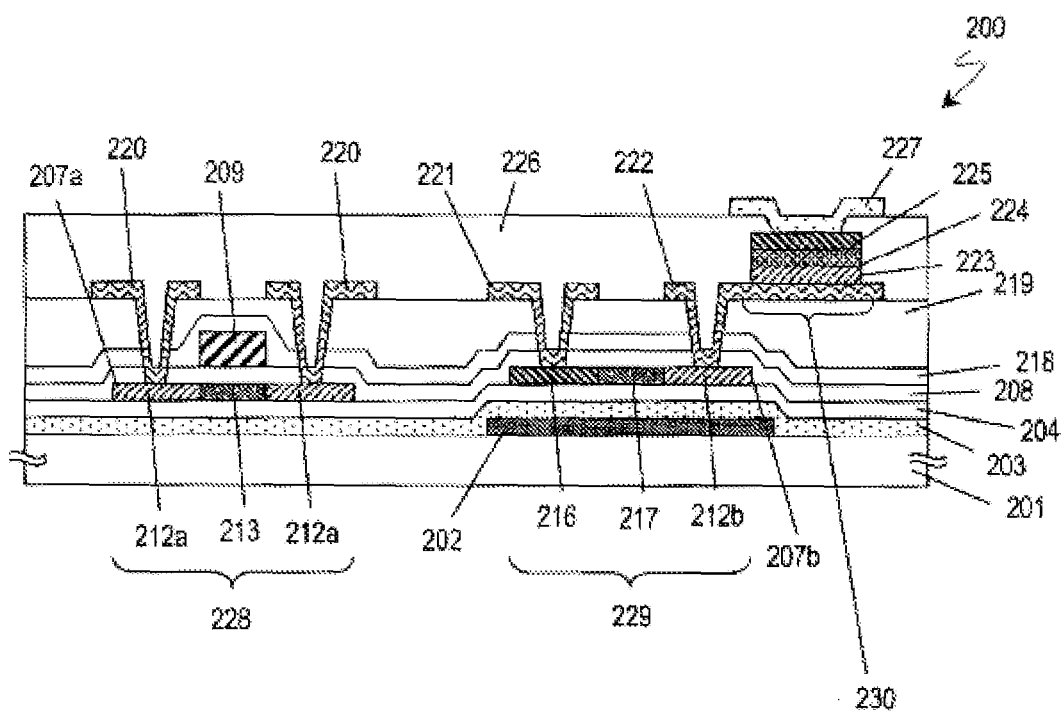
FIG. 7 is a schematic cross-sectional drawing showing a semiconductor device of Embodiment 2 of the present invention.

FIG. 7 is a schematic cross-sectional drawing showing a semiconductor device of the present embodiment. Although the semiconductor device of the present embodiment typically has a plurality of TFTs and a plurality of optical sensor units arranged on the same substrate, for the purpose of this drawing, the TFT and two types of optical sensor TFDs in the optical sensor unit are respectively illustrated as one component each.

The semiconductor device 200 of the present embodiment is equipped with a thin film transistor 228, a lateral structure type thin film diode 229, and a stacked structure thin film diode 230. The thin film transistor 228 and the thin film diode 229 are formed on a substrate 201 through base films 203 and 204, respectively. The thin film diode 230 is formed above the thin film diode 229 and uses the electrode-line 222 of the thin film diode 229 as the bottom electrode. The thin film diode 229 and the thin film diode 230 are connected together in parallel.

The thin film transistor 228 has a semiconductor layer 207a including a channel region 213 and source and drain regions 212a, a gate electrode 209 arranged on the semiconductor layer 207a via a gate insulation film 208, and electrodes-lines 220 connecting respectively to the source region and drain region 212a. The thin film diode 229 has at least a semiconductor layer 207b including an n-type region 212b and a p-type region 216, and has electrodes-lines 222 and 221 connecting to the n-type region 212b and the p-type region 216, respectively. The semiconductor layer 207a of the thin film transistor 228 and the semiconductor layer 207b of the thin film diode 229 are crystalline semiconductor layers (e.g., c-Si layers) formed from the same film.

The thin film diode 230 has a semiconductor layer (stacked layer semiconductor layer) stacked with an n-type (n$^+$ type) a-Si layer 223, an intrinsic (i-type) a-Si layer 224, and a p-type (p$^+$ type) a-Si layer 225 and has a transparent electrode 227 arranged on top of the stacked layer semiconductor layer. The electrode 227, for example, is an ITO electrode. Within the stacked layer semiconductor layer, the n-type a-Si layer 223 positioned closest to the substrate is electrically connected to the n-type region 212b of the thin film diode 229 by the electrode-line 222. Although not shown in the figures, the p-type a-Si layer 225 positioned uppermost within the stacked layer semiconductor layer is electrically connected to the electrode-line 221 of the thin film diode 229 by the electrode 227.

A silicon nitride film 218 and a silicon oxide film 219 are formed as a first interlayer insulation film on the gate electrode 209 of thin film transistor 228. Moreover, an organic insulation film 226 of an acrylic base or the like is formed as a second interlayer insulation film over the electrodes-lines 220, 221, and 222 and the thin film diode 230. When the substrate used as the substrate 201 is transparent, in order to prevent light from entering the semiconductor layer 207b of the thin film diode 229 from the backside face of the substrate 201, a light shielding layer 202 is preferably arranged between the semiconductor layer 207b and the substrate 201. Since the stacked layer semiconductor layer of the thin film diode 230 is shielded from light by the electrode-line 222, there is no need to provide a separate light shielding layer.

As explained previously with reference to FIG. 3, the maximum wavelength capable of being sensed by c-Si is longer than the maximum wavelength that can be sensed by a-Si. Therefore, in the present embodiment, the wavelength range that can be sensed by the thin film diode 229, which has the c-Si layer, includes a wavelength that is longer than the maximum wavelength of the wavelength range that can be sensed by the thin film diode 230, which has a semiconductor layer formed of a-Si. The thin film diode 230 is equivalent to the thin film diode 701A shown in FIG. 1, and the thin film diode 229 is equivalent to the thin film diode 701B shown in FIG. 1.

The optical sensor unit in the present embodiment has the two types of sensor TFDs (thin film diodes 229 and 230) shown in FIG. 7, and thus in the same manner as the above described Embodiment 1, it is possible to sense light over a wider wavelength range. The sensitivity of sensing is also increased. In particular, when one of two types of optical sensor TFDs uses a crystalline semiconductor layer as the active region, and when the other optical sensor TFD uses an amorphous semiconductor layer as the active region, it is possible to perform sensing of infrared light by use of the TFD (thin film diode 229) that has the crystalline semiconductor layer, and it is possible to perform sensing of visible light by use of the TFD (thin film diode 230) that has the amorphous semiconductor layer. As a result, it is possible to increase sensitivity of sensing over a wavelength range from infrared light to visible light.

Moreover, in the same manner as in Embodiment 1, using the optical sensor unit 700 shown in FIG. 1, it is possible to send forward electrical current through the TFD (thin film diode 229) that has the higher electrical current driving force among the two types of optical sensor TFDs. It is thus possible to reset the signal only using the TFD, and an extra TFT becomes unnecessary. As a result, circuit arrangement in the pixel can be simplified as shown in the circuit diagram, and there are also improvements in yield and aperture ratio.

Furthermore, according to the present embodiment, the PIN structure is adopted for the stacked layer structure of one of the optical sensor TFDs (thin film diode 230). It is possible by this means to greatly increase the PIN junction area, which generates the optical leakage current. Since the semiconductor layer 207b and stacked layer semiconductor layers 223 through 225 of the respective optical sensor TFDs are formed of respective separate layers, it is possible to control the thickness and crystallinity of the respective semiconductor layers independently. It is thus possible to optimize the semiconductor layer 207b and the stacked layer semiconductor layers 223 through 225 according to the characteristics required for the respective optical sensor TFDs.

The method of production of the semiconductor device of the present embodiment will be explained next.

Figure 8:
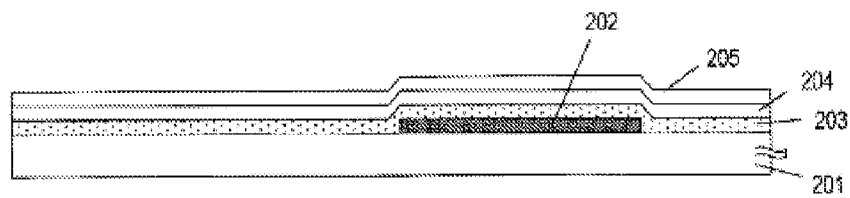
FIGS. 8 (A) through (E) are schematic cross-sectional drawings showing a manufacture process of the semiconductor device of Embodiment 2 of the present invention.
Figure 8:
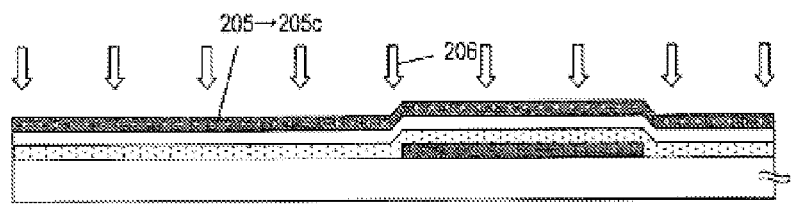
Figure 8:
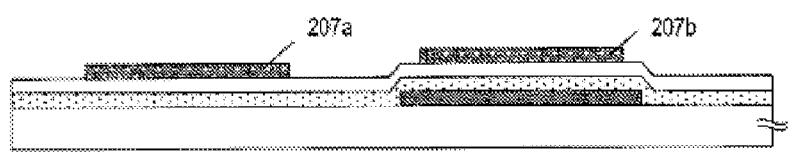
Figure 8:
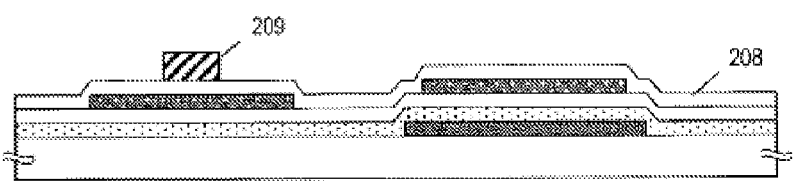
Figure 8:
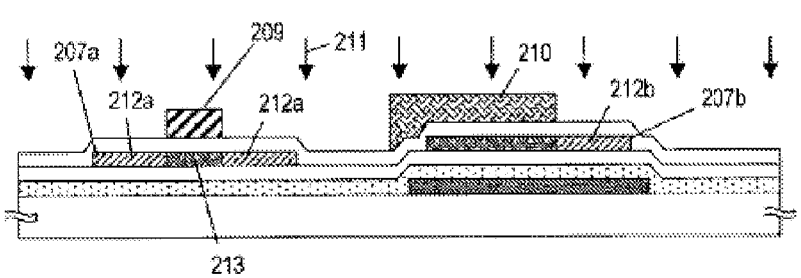

First, as shown in FIG. 8 (A), a light shielding layer 202 is patterned and formed on the substrate 201, and the silicon nitride film 203 and the silicon oxide film 204 are formed as base films. Next, an amorphous silicon (a-Si) film 205 is formed. The method for formation is the same as that described previously with reference to FIG. 4 (A). Thickness of the a-Si amorphous silicon film 205 is 50 nm, for example.

Then, as shown in FIG. 8 (B), laser light 206 is irradiated against the amorphous silicon film 205 from above the substrate 201 so that the a-Si film 205 is crystallized to form the crystalline Si film 205c.

After this, as shown in FIG. 8 (C), the crystalline Si film 205c is separated into island-shape regions to form the semiconductor layer 207a that becomes a TFT active region and the semiconductor layer 207b that becomes an optical sensor TFD active region.

Next, as shown in FIG. 8 (D), the gate insulation film 208 is formed so as to cover the semiconductor layers 207a and 207b, and the gate electrode 209 is formed so as to partly overlap the semiconductor layer 207a of the TFT. The method of formation of the gate insulation film 208 and the gate electrode 209 is similar to the method that was explained previously with reference to FIG. 5 (E).

After this, as shown in FIG. 8 (E), a mask 210 is formed by a photoresist so as to partially cover the semiconductor layer 207b. In this state, the semiconductor layers 207a and 207b are doped with an n-type impurity (phosphorus) 211 from above the substrate 201. By this means, within the semiconductor layer 207a, the regions where phosphorus 211 was implanted become the source-drain regions 212a of the TFT, and the region masked by the gate electrode 209 that was not implanted by phosphorus 211 becomes the channel region 213 of the TFT. Within the semiconductor layer 207b, the region where phosphorus 221 was implanted becomes the n-type region 212b of the TFD.

Figure 9:
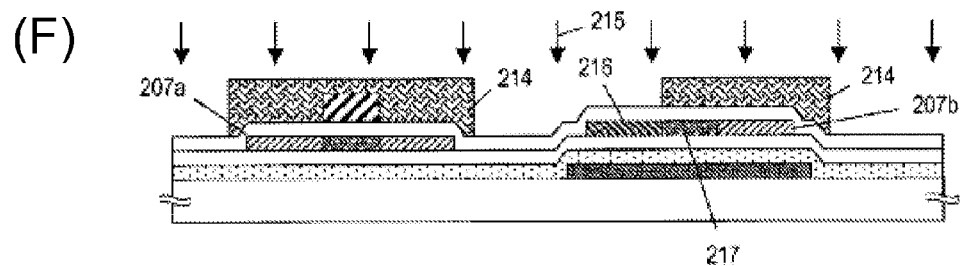
FIGS. 9 (F) through (H) are schematic cross-sectional drawings showing a manufacture process of the semiconductor device of Embodiment 2 of the present invention.
Figure 9:
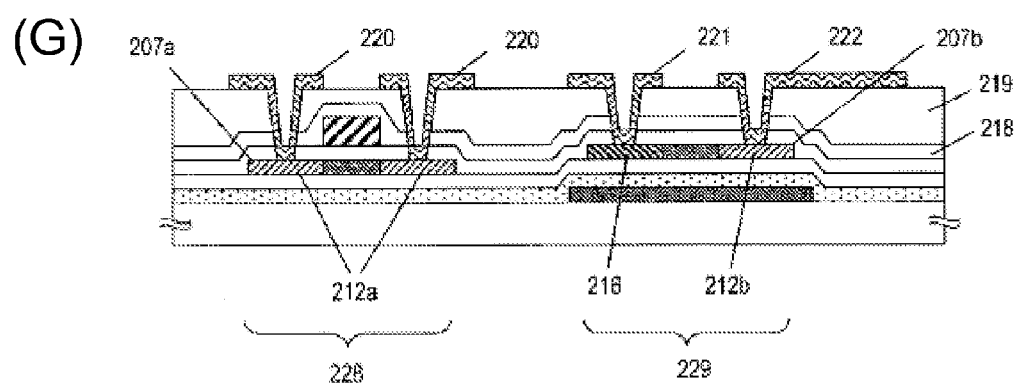
Figure 9:
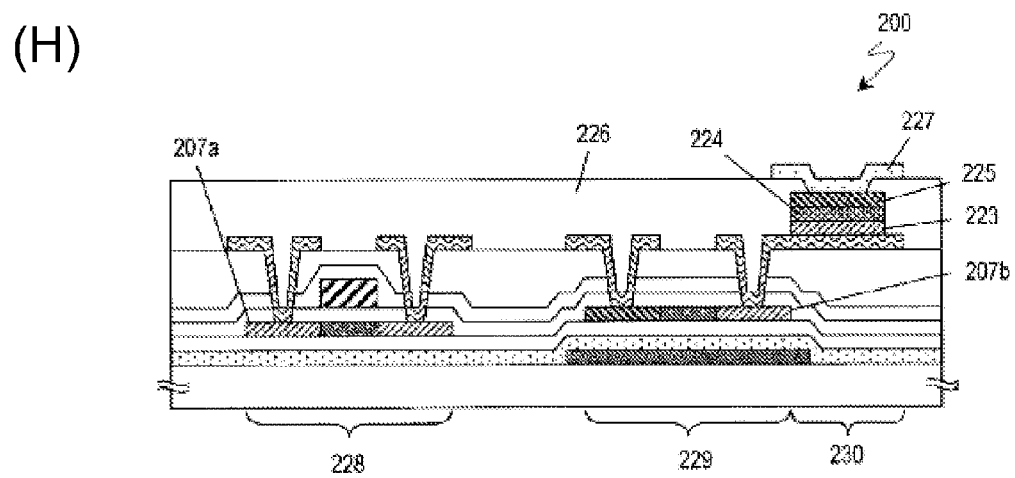

After removal of the mask 210, as shown in FIG. 9 (F), a new mask 214 is formed covering the entire semiconductor layer 207a and part of the semiconductor layer 207b. In this state, a p-type impurity (boron) 215 is used to dope the semiconductor layer 207b from above the substrate 201. By this means, within the semiconductor layer 207b, the region where boron 215 was implanted becomes the p-type region 216 of the TFD. Within the semiconductor layer 207b, the region where neither phosphorus nor boron was implanted becomes the intrinsic region 217.

After removal of the mask 214, a heat treatment is performed in an inert atmosphere, or a nitrogen atmosphere, for example, to cause activation of the regions 212a, 212b, and 216 that were implanted with impurities.

Next, as shown in FIG. 9 (G), the silicon nitride film 218 and the silicon oxide film 219 are formed in that order as interlayer insulating films. If desired, the semiconductor layers 207a and 207b may be heat treated for hydrogenation. The heat treatment method is similar to the method described earlier with reference to FIG. 6 (I). After this, contact holes are formed in the interlayer insulation films 218 and 219. Then, a film formed of a metal material (e.g., a double layered film of titanium nitride and aluminum) is deposited on the interlayer insulation film 219 and within the contact holes, and this film is patterned to form the TFT electrode-line 220 and the TFD electrodes-lines 221 and 222. The TFD electrode-line 221 electrically contacts the p-type region 216, and the TFD electrode-line 222 electrically contacts the n-type region 212b. The thin film transistor 228 and the thin film diode 229 are obtained in this manner.

After this, an n-type (n$^+$) a-Si film, an intrinsic (i) a-Si film, and a p-type (p$^+$) a-Si film are formed in that order on the TFD electrode-line 222 using the plasma CVD method, for example. Thereafter, these a-Si films are patterned, as shown in FIG. 9 (H), to obtain the stacked layer semiconductor layer constituted by the n-type a-Si layer 223, the intrinsic a-Si layer 224, and the p-type a-Si layer 225. Here, the thickness of the n-type a-Si layer 223 is 30 nm, the thickness of the intrinsic a-Si layer 224 is 350 nm, and the thickness of the p-type a-Si layer 225 is 10 nm. The stacked layer semiconductor layers 223 through 225 are disposed overlapping the electrode 222.

Next, the second interlayer insulation film 226 is formed covering the stacked layer semiconductor layers 223 through 225, the thin film transistor 228, and the thin film diode 229. The second interlayer insulation film 226 may be a resin film formed by spin-coating in order to increase flatness. After this, in the second interlayer insulation film 226, an opening is formed in the part located above the stacked layer semiconductor layers, and the transparent electrode 227 is provided for connection with the p-type a-Si layer 225 of the stacked layer semiconductor layers. The thin film diode 230 is obtained in this manner.

The electrode 227 is formed using a transparent electrically conductive material such as ITO or the like. The transparent electrode 227 contacts the electrode-line 221 of the thin film diode 229. For example, through holes are formed in the second insulation film 226 above the electrode-line 221, and within the through holes and upon the second interlayer insulation film 226, a line (not illustrated) is provided that electrically connects the electrode-line 221 to the electrode 227. This line and the electrode 227 may be formed using the same film (ITO film). The electrode-line 222 of the thin film diode 229 is also used as the bottom electrode of the thin film diode 230. By providing the above described line, the thin film diode 229 and the thin film diode 230 can be connected in parallel.

Light enters the thin film diode 230 from above the substrate 201 through the transparent electrode 227. On the other hand, light from below (substrate 201 side) the thin film diode 230 is blocked by the electrode-line 222, which is the bottom electrode, so that such light does not enter the thin film diode 230. That is to say, the electrode-line 222 also acts as a light shielding layer for the thin film diode 230.

According to the above described method, the a-Si layers 223 through 225 that become the active region of the thin film diode 230 are formed separately from the semiconductor layers 207b and 207a of the thin film diode 229 and the thin film transistor 228, respectively. It is thus possible to form the a-Si layers 223 through 225 under optimal process conditions for the characteristics required for the thin film diode 230.

Moreover, the thickness of the a-Si layers 223 through 225 of the thin film diode 230 can be optimized, regardless of the thicknesses of the semiconductor layers 207b and 207a of the thin film diode 229 and the thin film transistor 228, respectively. This results in an ability to increase the utilization efficiency of light. For example, the thickness of the intrinsic a-Si layer 224 of the thin film diode 230 is preferably greater than or equal to 200 nm and less than or equal to 700 nm. The thicknesses of the semiconductor layers 207b and 207a of the thin film diode 229 and the thin film transistor 228, respectively, are preferably greater than or equal to 35 nm and less than or equal to 100 nm. By making the thickness of the intrinsic a-Si layer 224 greater than thicknesses of the semiconductor layers 207a and 207b, light sensitivity of the thin film diode 230 can be increased while securing characteristics of the thin film transistor 228.

Embodiment 3

Embodiment 3 of the semiconductor device of the present invention will be explained below. In the aforementioned Embodiments 1 and 2, in order to explain the basic form of the present invention in a readily understood manner, methods for the manufacture of semiconductor devices of the simplest possible structure were explained, as exemplified by methods that formed an n-channel type TFT and two types of optical sensor TDFs on the same substrate. In this embodiment, a plurality of TFTs and TFDs having different structures and different types of conductivity are provided on the same substrate, and an explanation is provided for the structure and method of the manufacture of a semiconductor device that is capable of being used for electronic equipment having an optical sensor unit and a display unit.

Figure 10:
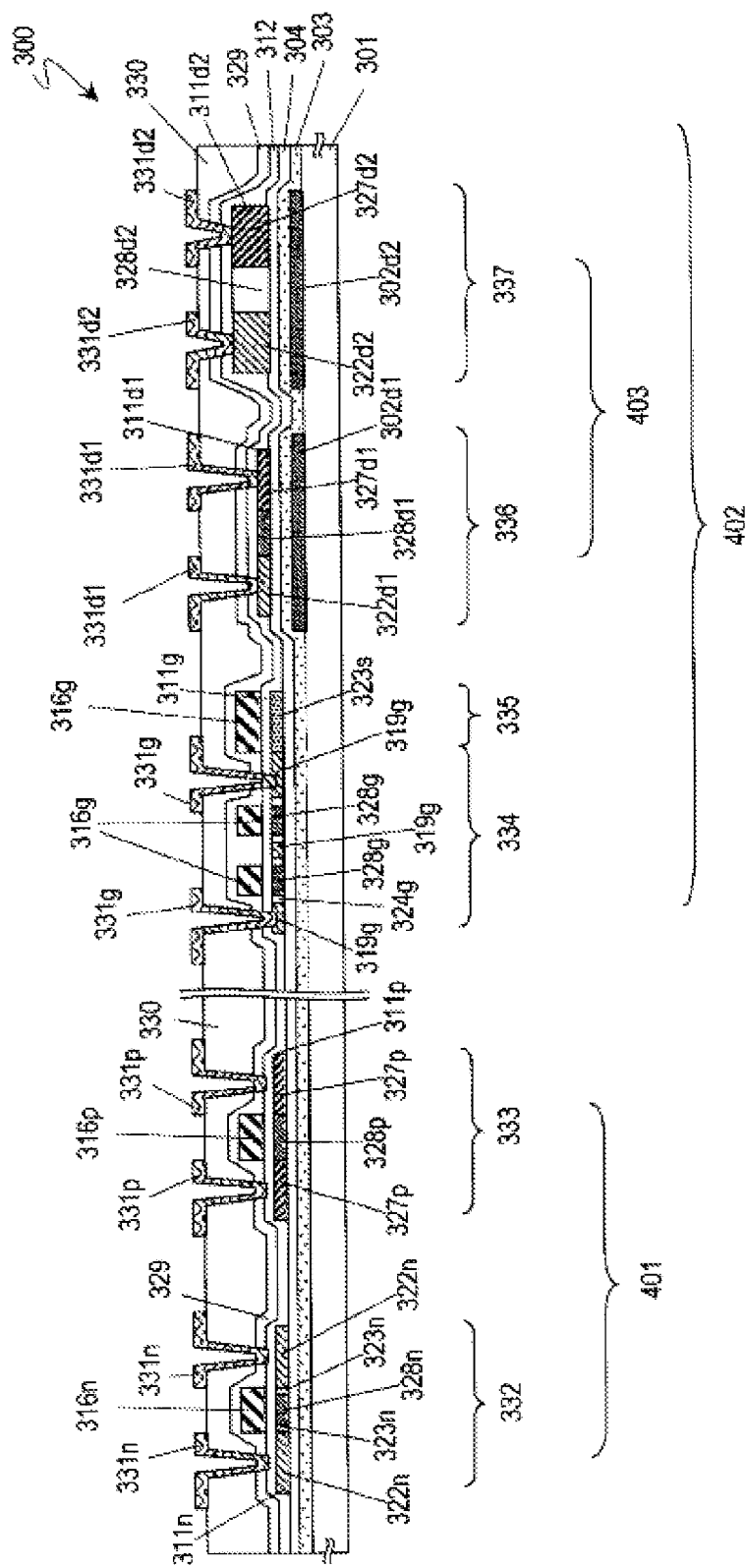
FIG. 10 is a schematic cross-sectional drawing showing a semiconductor device of Embodiment 3 of the present invention.

FIG. 10 is a schematic cross-sectional drawing showing a semiconductor device of the present embodiment.

The semiconductor device 300 is an active matrix substrate of a display device that has an optical sensor function. The semiconductor device 300 includes, on the same substrate, a circuit part 401 including a plurality of TFTs, a pixel part (termed the "display region") 402 including a plurality of pixels, and a plurality of optical sensor units 403 arranged at the pixel part. For simplicity, FIG. 10 shows one component each of the TFTs used the circuit part 401 and the pixel part 402, and the two types of optical sensor TFDs used in the optical sensor unit. An explanation of the structural elements of each TFT and TFD will be provided later during explanation of the manufacture method, and therefore, is omitted here.

Circuit part 401 includes an n-channel type thin film transistor 332 and a p-channel type thin film transistor 333. In the present embodiment, a GOLD (Gate Overlapped LLD) structure TFT, which has high reliability with respect to hot carrier degradation, is used as the n-channel type thin film transistor 332. A TFT that lacks an LDD region (i.e., a so-called single drain structure TFT) is used as the p-channel type thin film transistor 333.

The pixel part 402 is provided at each pixel and includes a thin film transistor (pixel TFT) 334, which functions as a switching element, and an auxiliary capacitance 335 connected to the thin film transistor 334. An LLD structure TFT, which has an LLD region offset from the gate electrode toward the source-drain regions side, is used as the thin film transistor 334 in order to lower the OFF current. In order to distribute the voltage applied between the source and drain and to effectively suppress the OFF electrical current, a structure in which two gate electrodes are disposed in series with respect to a single semiconductor layer (dual gate structure) is preferred.

Each optical sensor unit 403 includes two types of optical sensor thin film diodes 336 and 337 having a lateral structure. Structure of the optical sensor unit 403, for example, is similar to the structure previously mentioned with reference to FIG. 1. Each optical sensor unit 403 is disposed in a single pixel or in multiple pixels.

In the present embodiment, the semiconductor layers of the thin film transistors, 332, 333, and 334 used by the circuit part 401 and the pixel part 402, and the semiconductor layer of the thin film diode 336 used by the optical sensor unit 403 are crystalline semiconductor layers. The semiconductor layer of the thin film diode 337 is an amorphous semiconductor layer, which has a thickness greater than the thicknesses of the semiconductor layers of the thin film transistors 332, 333, and 334 and the thin film diode 336. As explained earlier with reference to FIG. 1, the thin film diodes 336 and 337 are connected together in parallel, and the wavelength range capable of being sensed by the thin film diode 336 includes a wavelength longer than the maximum wavelength of the wavelength range capable of being sensed by the thin film diode 337. Therefore the thin film diode 337 is equivalent to the thin film diode 701A shown in FIG. 1, and the thin film diode 336 is equivalent to the thin film diode 701B shown in FIG. 1

The crystalline semiconductor layers or amorphous semiconductor layers of these active regions of the TFTs and TFDs are preferably formed using the same amorphous semiconductor film. For example, within the amorphous semiconductor film, by selectively making the region for formation of the semiconductor layer of the thin film diode 337 thicker, this difference in thickness can be used during the crystallization step to keep the region that becomes the semiconductor layer of the thin film diode 337 amorphous, within the amorphous semiconductor film, while causing crystallization of other regions. After this, it is possible to form from the crystallized regions the semiconductor layers of the thin film transistors 332, 333, and 334 and the thin film diode 336, and it is possible to form the semiconductor layer of the thin film diode 337 from the other region that remains amorphous.

A more detailed explanation of a method for the manufacture of the semiconductor device of the present embodiment will be described below.

Figure 11:
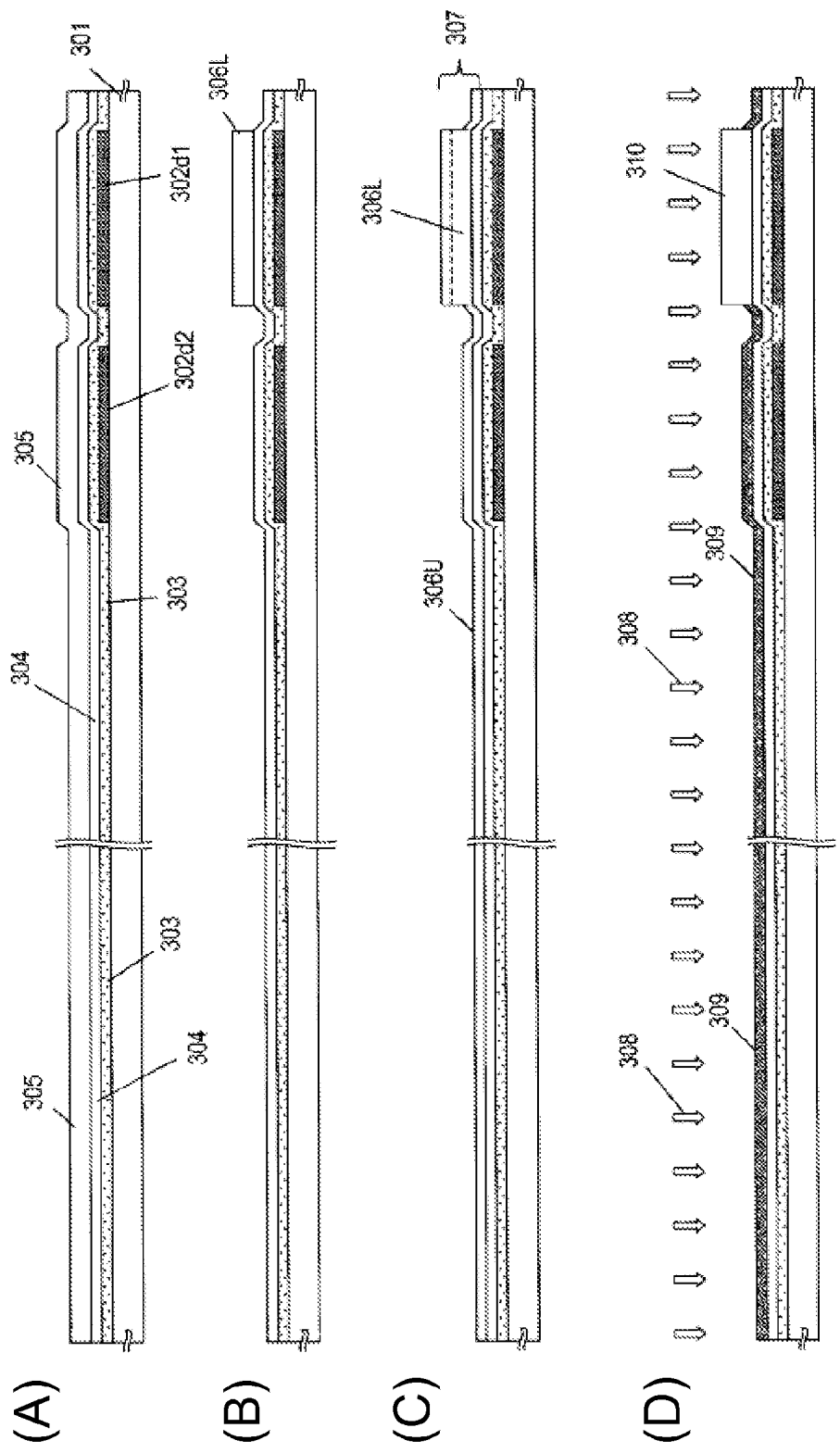
FIGS. 11 (A) through (D) are schematic cross-sectional drawings showing a manufacture process of the semiconductor device of Embodiment 3 of the present invention.

First, as shown in FIG. 11 (A), the light shielding layers 302d1 and 302d2 are patterned and formed on a substrate 301, and a silicon nitride film 303 and a silicon oxide film 304 are formed thereafter as base films. Next, a first amorphous semiconductor film 305 (here, an a-Si film) is formed. The method for formation of these films is similar to the method mentioned previously with reference to FIG. 4 (A). Moreover, the thickness of the amorphous silicon film 305 is 50 to 300 nm, or 150 nm, for example.

After this, as shown in FIG. 11 (B), the a-Si film 305 is patterned, and on the substrate 301, an island-shape lower layer film 306L is formed of amorphous silicon in the region for formation of the optical sensor TFD using the amorphous semiconductor layer.

Next, as shown in FIG. 11 (C), an upper layer film 306U is formed of amorphous semiconductor (a-Si) over the entire surface of the substrate 301 so as to cover the lower layer film 306L. The thickness of the upper layer film 306U is set to 40 nm, for example. The amorphous silicon film (a-Si film) 307, which is made of the lower layer film 306L and the upper layer film 306U, is obtained in the manner. In the region for formation of the TFD, the a-Si film 307 is made thicker than the region for formation of the TFT and auxiliary capacitance by the thickness amount of the lower layer film 306L. In the present embodiment, the thickness of the thick part of the a-Si film 307 is 190 nm (total thickness of the lower layer film 306L and the upper layer film 306U), and the thickness of the thin part is 40 nm (thickness of the upper layer film 306U alone).

Then, as shown in FIG. 11 (D), the a-Si film 307 is irradiated from above the substrate 301 with laser light 308 to cause crystallization. By this means, within the a-Si film 307, only the thin part crystallizes and forms the crystalline region 309. At this time, due to the large thermal capacity of the thick part, the thick part does not melt even when irradiated by the laser light 308 and remains amorphous (amorphous region 310). In the present embodiment, XeCl excimer laser light of 308 nm wavelength is used as the laser light 308. Moreover, beam dimensions of the laser light 308 are set to form an elongated pattern on the surface of the substrate 301, and the beam is scanned sequentially in the direction perpendicular to the elongated direction so that the entire surface of the substrate is irradiated.

Figure 12:
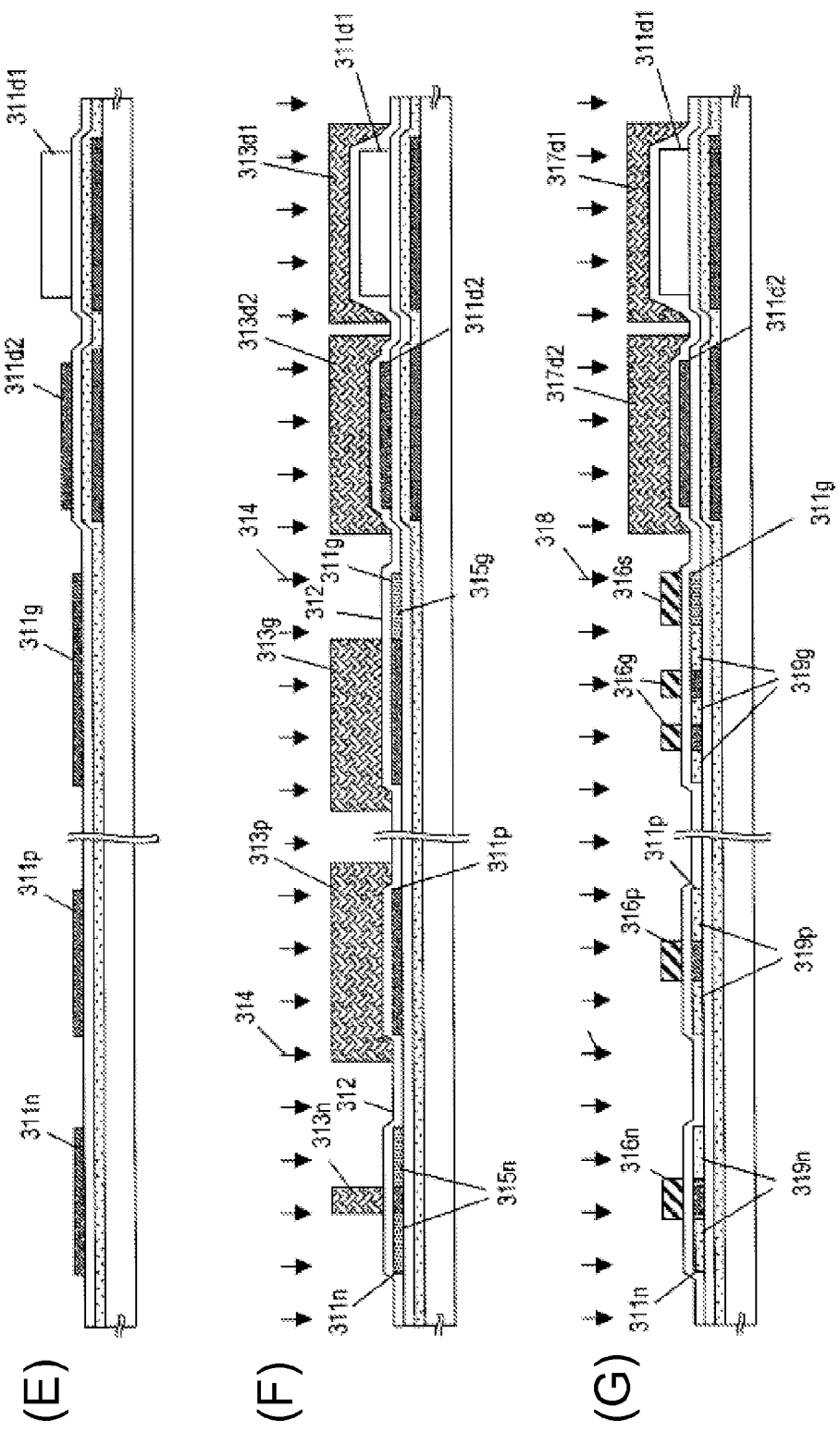
FIGS. 12 (E) through (G) are schematic cross-sectional drawings showing a manufacture process of the semiconductor device of Embodiment 3 of the present invention.

Next, as shown in FIG. 12 (E), the film that includes the crystalline region 309 and the amorphous region 310 is divided into island-shape regions. The semiconductor layer 311n that becomes the active region of the n-channel type TFT, the semiconductor layer 311p that becomes the active region of the p-channel type TFT, the semiconductor layer 311g that becomes the bottom electrode of the auxiliary capacitance and the active region of the pixel TFT, and the semiconductor layer 311d2 that becomes the active region of the optical sensor TFD are formed using the crystalline region 309. Moreover, the semiconductor layer 311d1 that becomes the active region of the other optical sensor TFD is formed using the amorphous region 310.

Next, as shown in FIG. 12 (F), a gate insulation film 312 is formed to cover the semiconductor layers 311n, 311p, 311g, 311d2, and 311d1. After this, a photoresist is used to form doping masks 313n, 313p, 313g, 313d2, and 313d1 on the gate insulation film 312. The doping mask 313n is positioned to cover the part of the semiconductor layer 311n that becomes the channel region. The doping mask 313g is positioned to cover those parts of the semiconductor layer 311g that do not become the auxiliary capacitance. The doping masks 313p, 313d2, and 313d1 are positioned so as to cover the entire semiconductor layers 311p, 311d2, and 311d1, respectively.

In this state, in the semiconductor layers 311n and 311g, those parts that are not covered by the doping masks 313n or 313g are doped using a low concentration of an n-type impurity (phosphorus) 314. Phosphine ($PH_3$) is used as the dopant gas, the acceleration voltage is set to 60 to 90 kV, or 70 kV, for example, and the dose amount is set to $1\times10^{12}$ to $1\times10^{14}$ $cm^{-2}$, or $2\times10^{13}$ $cm^{-2}$, for example. The first low concentration n-type regions 315n are formed on portions (the parts that become the source-drain regions and the LDD regions) of the semiconductor layer 311n that becomes the active region of the n-channel type TFT in this step. Moreover, a first low concentration type region 315g is formed on a portion (the part that becomes the auxiliary capacitance) of the semiconductor layer 311g that becomes the auxiliary capacitance and the active region of the pixel TFT. The remaining regions are not implanted by low concentration phosphorus 314.

After this, the doping masks 313n, 313p, 313g, 313d2, and 313d1 are removed. Then as shown in FIG. 12 (G), in addition to forming the gate electrodes 316n and 316p over the semiconductor layers 311n and 311p, respectively, the two gate electrodes 316g and the upper electrode 316s of the auxiliary capacitance part are formed over the semiconductor layer 311g. Thereafter, the resist mask 317d2 is provided to cover the entire semiconductor layer 311d2, and the resist mask 3117d1 is provided to cover the entire semiconductor layer 311d1.

The gate electrode 316n is disposed so as to cover the part of the semiconductor layer 311n that becomes the channel region and to overlap part of the low concentration n-type regions 315n at both sides thereof. The gate electrode 316p is disposed so as to overlap the part of the semiconductor layer 311p that becomes the channel region. The gate electrodes 316g are disposed so as to overlay each of the two parts of the semiconductor layer 311g that become the channel regions.

In this state, the semiconductor layers 311n, 311p, and 311g are doped using the second n-type impurity (phosphorus) 318 at low concentration. Phosphine ($PH_3$) is used as the dopant gas, the acceleration voltage is set to 60 to 90 kV, or 70 kV, for example, and the dose amount is set to $1 \times 10^{12}$ to $1 \times 10^{14}$ cm$^{-2}$, or $2 \times 10^{13}$ cm$^{-2}$, for example. By this means, second low concentration n-type regions 319n, 319p, and 319g are formed within the semiconductor layers 311n, 311p, and 311g, respectively, at the parts not covered by the gate electrodes 316n, 316p, and 316g, respectively.

Figure 13:
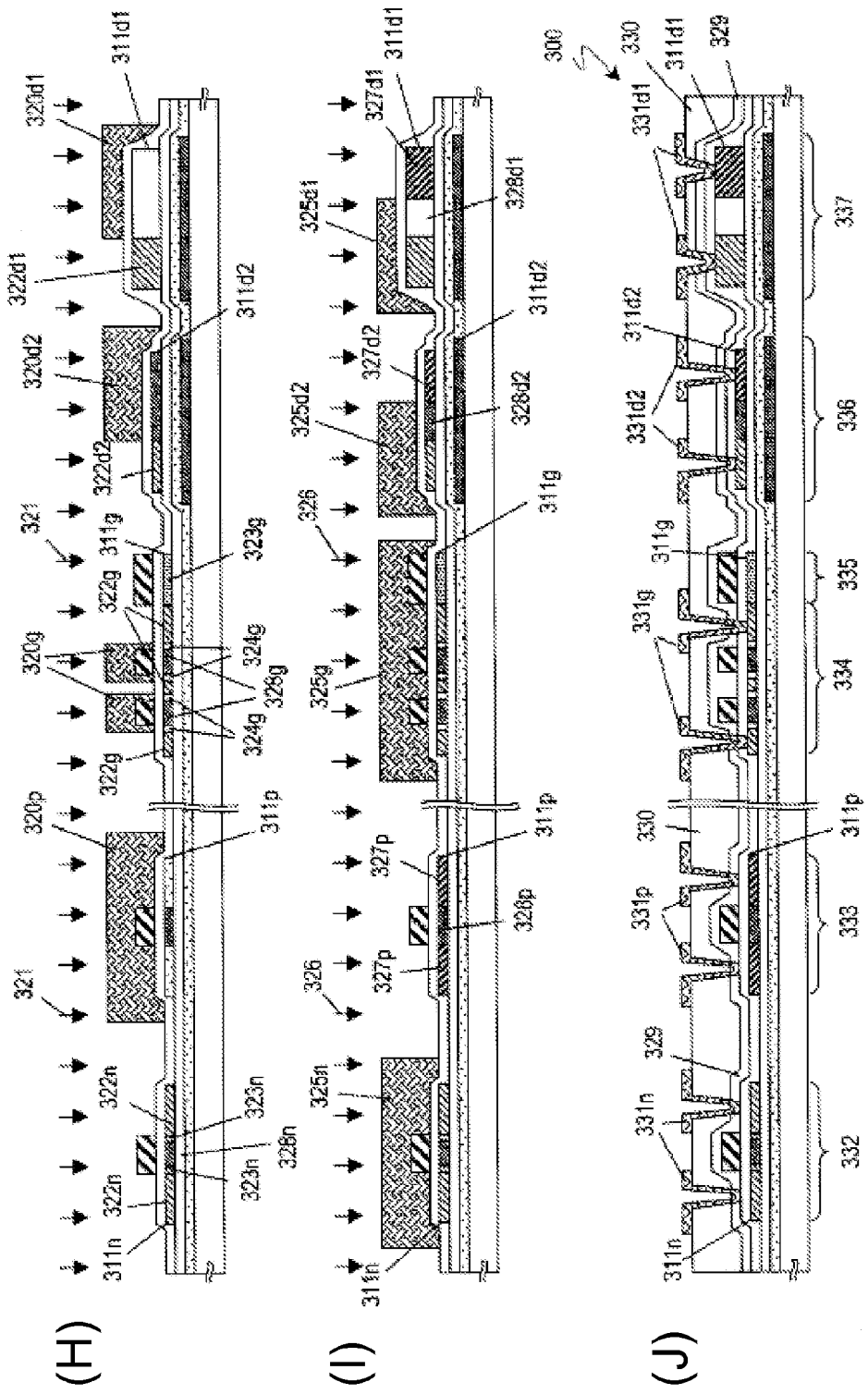
FIGS. 13 (H) through (J) are schematic cross-sectional drawings showing a manufacture process of the semiconductor device of Embodiment 3 of the present invention.

After removal of the resist masks 317d2 and 317d1, as shown in FIG. 13 (H), new resist masks 320p, 320g, 320d2, and 320d1 are formed on the semiconductor layers 311p, 311g, 311d2, and 311d1, respectively. The resist mask 320p is formed so as to cover the entire semiconductor layer 311p. The resist masks 320g are disposed so as to cover the gate electrodes 316g on the semiconductor layer 311g and to cover the parts of the second low concentration n-type region 319g that are positioned at both sides of the gate electrodes 316g. The resist masks 320d2 and 320d1 are disposed so as to cover those parts of the semiconductor layers 311d2 and 311d1 that do not become the n-type regions.

In this state, doping is performed using a high concentration of n-type impurity (phosphorus) 321. Phosphine ($PH_3$) is used as the dopant gas, the acceleration voltage is set to 60 to 90 kV, or 70 kV, for example, and the dose amount is set to $1 \times 10^{15}$ to $1 \times 10^{16}$ cm$^2$, or $5 \times 10^{15}$ cm$^{-2}$, for example. By this means, within the semiconductor layer 311n that becomes the active region of the n-channel type TFT, the source-drain regions 322n are formed at the parts that are not covered by the gate electrode 316n. In the second low concentration n-type region 319n, the parts that were covered by the gate electrode 316n, where phosphorus 321 was not implanted, become the GOLD regions 323n. The part that was sandwiched by the GOLD regions 323n where phosphorus was not implanted becomes the channel region 328n. Moreover, phosphorus 321 is not implanted in the semiconductor layer 311p that becomes the active region of the p-channel type TFT. On the other hand, in the semiconductor layer 311g that becomes the active region of the pixel TFT and the auxiliary capacitance, those parts that were not covered by the resist masks 320g where phosphorus 321 was implanted at high concentration become the source-drain regions 322g. Within the parts of the second low concentration n-type region 319g, those parts that were covered by the resist masks 320g where phosphorus 321 was not implanted become the LLD regions 324g. Moreover, in the semiconductor layer 311g, the parts that were covered by the gate electrodes 316g become the channel regions 328g, the part that was covered by the upper electrode 316s remains as the first low concentration n-type region 323g, becoming the bottom electrode of the auxiliary capacitance. Furthermore, in the semiconductor layers 311d2 and 311d1 that become the TFD active regions, the parts not covered by the masks 320d2 or 320d1 form the n-type regions 322d2 and 322d1.

Furthermore, in the present embodiment, the LDD region overlapped by the gate electrode is called the "GOLD region," and this is distinguished from the LDD region, which is not overlapped by the gate electrode (called simply the "LDD region").

After this, the masks 320p, 320g, 320d2, and 320d1 are removed, and as shown in FIG. 13 (I), new resist masks 325n, 325g, 325d2, and 325d1 are formed on the semiconductor layers 311n, 311g, 311d2, and 311d1, respectively. The resist masks 325n and 325g are formed to cover the entire layers 311n and 311g, respectively. In the semiconductor layers 311d2 and 311d1, the resist masks 325d2 and 325d1 are disposed so as to cover parts that do not become p-type regions.

In this state, doping is performed using a p-type impurity (boron) 326. Diborane ($B_2H_6$) is used as the dopant gas, the acceleration voltage is set to 40 to 90 kV, or 75 kV, for example, and the dose amount is set to $1 \times 10^{15}$ to $1 \times 10^{16}$ cm$^{-2}$, or $3 \times 10^{15}$ cm$^2$, for example. By this means, in the semiconductor layer 311p that becomes the active region of the p-channel type TFT, the source-drain regions 327p are formed in the parts that are not covered by the gate electrode 316p. In the semiconductor layer 311p, the part that is covered by the gate electrode 316p where boron 326 is not implanted becomes the channel region 328p. A high concentration of boron 326 is not implanted in the semiconductor layers 311n and 311g. In the semiconductor layers 311d2 and 311d1 of the TFDs, the parts where a high concentration of boron was implanted form the p-type regions 327d2 and 327d1, respectively. In the semiconductor layers 311d2 and 311d1, those parts where phosphorus or boron was not implanted become the intrinsic regions 328d2 and 328d1, respectively.

Next, the masks 325n, 325g, 325d2, and 325d1 are removed. Then, a heat treatment is performed to activate the impurities (phosphorus and boron) that were implanted in the various semiconductor layers. The conditions and method of the activation treatment may be similar to the conditions and method explained in the first embodiment, for example.

Next, as shown in FIG. 13 (J), a silicon nitride film 329 and a silicon oxide film 330 are formed in that order, as interlayer insulation films. If desired, a heat treatment may be performed for hydrogenation. Thereafter, using a method similar to that explained previously with reference to FIG. 6 (I), contact holes are formed in the interlayer insulation films 329 and 330, and the electrodes-lines 331n, 331p, 331g, 331d2, and 331d1 are formed.

The n-channel type thin film transistor 332, the p-channel type thin film transistor 333, the thin film transistor 334 used for the pixel, the auxiliary capacitance 335, and the optical sensor thin film diodes 336 and 337 are obtained in this manner. Furthermore, contact holes may also be provided upon the gate electrodes of the thin film transistors 332 and 333 constituting a circuit, and these gate electrodes may be connected to the source-drain regions or gate electrodes of other TFTs on the substrate using the source-drain lines. If necessary, a protective film may be provided upon these elements.

The active region of the thin film diode 336 is constituted of a crystalline semiconductor layer, and the active region of the thin film diode 337 is constituted of an amorphous semiconductor layer. Therefore, the wavelength range capable of being sensed by the thin film diode 336 includes a wavelength longer than the maximum wavelength in the wavelength range capable of being sensed by the thin film diode 337. Similar to the aforementioned embodiments, these two thin film diodes 336 and 337 are connected together in parallel. That is, the electrode connected to the n-type region among the electrodes 331$d$2, and the electrode connected to the n-type region among the electrodes 331$d$1 are connected in a planar manner. The electrode connected to the p-type region among the electrodes 331$d$2, and the electrode connected to the p-type region among the electrodes 331$d$2 are connected in a planar manner. These electrodes may be connected directly by an electrode layer that includes the electrodes 331$d$1 and 331$d$2, or alternatively, these electrodes may be connected using a separate electrode layer formed over these electrodes.

According to the present embodiment, similarly to the above described embodiments, two types of optical sensor TFDs (thin film diodes 336 and 337) can be formed using semiconductor layers that have mutually different crystalline states. Thus, when these optical sensor TFDs are used, it is possible to construct an optical sensor unit that has high sensitivity and that is capable of sensing over a wide wavelength range.

Moreover, according to the above described method, the crystallization step is performed for the amorphous semiconductor film 307 that has partial differences in thickness. It is thus possible to manufacture separately the amorphous semiconductor layer 311$d$1 that becomes the active region of the optical sensor thin film diode 337 and the crystalline semiconductor region 311$d$2 that becomes the active region of the optical sensor thin film diode 336 with ease.

The amorphous semiconductor layer 311$d$1 obtained by the above described method becomes thicker than the crystalline semiconductor layer 311$d$2. The light (visible light) absorption of the optical sensor thin film diode 337 can be increased by making the amorphous semiconductor layer 311$d$1 thicker. It is thus possible to increase sensitivity for visible light.

On the other hand, controlling the thickness of the semiconductor layers of the thin film transistors 332 through 334 to a small thickness has the following effects. Leakage current during OFF operation is suppressed for the thin film transistor 334, which is the pixel TFT. Therefore, display flotation low contrast or display anomaly caused by the leakage current is suppressed, and failures such as point defects or the like can be decreased. In the thin film transistors 332 and 333 constituting a driver circuit, the breakdown voltage characteristics and reliability against the gate bias stress are improved. Moreover, the subthreshold characteristics and field effect mobility are improved, and therefore, it is possible to improve the drive performance of the driver circuit. Furthermore, because the thickness of the semiconductor layer constituting the bottom electrode of the auxiliary capacitance 335 is controlled to a small thickness, it is possible to improve the breakdown voltage characteristics of the auxiliary capacitance, and to reduce the rate of failure due to point defects or the like caused by leakage occurring at the auxiliary capacitance 335.

In this manner, according to the present embodiment, the semiconductor layers of the thin film transistors 332 through 334 and the semiconductor layers of the optical sensor thin film diodes 336 and 337 can be optimized according to respective applications and requirements, and it is possible to meet the desired device characteristics separately. Therefore, a display device that has a high sensor sensitivity, high quality display, and a small size of the non-display region can be realized, providing an ideal, compact interactive display device.

Moreover, according to the manufacture method of the present embodiment, the aforementioned type of display device can be manufactured by a process that is low-cost and requires a fewer number of process steps. In particular, like the aforementioned method, the manufacture process can be simplified by simultaneously carrying out the doping step for formation of the source-drain regions of the thin film transistors 332 through 334 and the doping step for formation of the n-type or p-type regions of the thin film diodes 336 and 337. Furthermore, forming the p-channel type and n-channel type thin film transistors 332 and 333 simultaneously (CMOS structure TFTs) is further advantageous since it is possible to simultaneously perform the n-type impurity doping step for the thin film diodes 336 and 337 and for the thin film transistor 332, and it is possible to simultaneously perform the doping step of the p-type impurity for the thin film diodes 336 and 337 and for the thin film transistor 333.

Embodiment 4

Display devices equipped with a sensor function will be explained in the present embodiment. Such devices are constructed using the semiconductor devices of any of the aforementioned embodiments.

The display device equipped with the sensor function of the present embodiment is a liquid crystal display device equipped with a touch sensor, for example, and this liquid crystal display device has a display region and a frame region positioned in the peripheral area of the display region. The display region has a plurality of display units (pixels) and a plurality of optical sensor units. Each display unit includes a pixel electrode and a TFT for pixel switching. Each optical sensor unit includes two types of optical sensor TFDs that have different wavelength ranges in which sensing is possible. In the frame region, a drive circuit is provided for the display in order to drive each of the display units, and drive circuit TFTs are used in this drive circuit. The pixel switching TFTs, the drive circuit TFTs, and the optical sensor unit TFDs are formed on the same substrate by methods such as those described in Embodiments 1 through 3. Furthermore, in the display device of the present invention, among the TFTs used in the display device, as long as the pixel switching TFTs are formed on the same substrate as the optical sensor unit TFDs by the above described methods, the drive circuit, for example, may be provided separately on another substrate.

In the present embodiment, the optical sensor unit is disposed adjacent to the corresponding display unit (the primary color pixel, for example). One optical sensor unit or multiple optical sensor units may be used for a single display unit. Alternatively, a single optical sensor unit may be used for a set of multiple display units. For example, a single optical sensor unit can be provided for a color display pixel constituted of three primary color (RGB) pixels. In this manner, the number (density) of optical sensor units relative to the number of display units can be selected appropriately according to the resolution.

Since the sensitivity of the TFD constituting the optical sensor unit may be lowered when a color filter is provided at the observer side of the optical sensor unit, the color filter is preferably not arranged at the observer side of the optical sensor unit.

When the intensity of ambient light is high, the optical sensor unit of the present embodiment uses ambient light to detect the shadow of the object (a finger pad or the like) contacting or approaching the screen. When the intensity of ambient light is low, the optical sensor unit of the present embodiment detects light reflected by the aforementioned object using infrared light emitted from the backlight. The intensity of the ambient light may be determined based on the average of outputs from multiple optical sensor units disposed in the display region. This type of configuration is advantageous because a separate illumination intensity sensor is not needed.

The structure of a display device of the present embodiment will be explained below with reference to the figures, using a touch panel liquid crystal display device equipped with a touch panel as an example.

Figure 14:
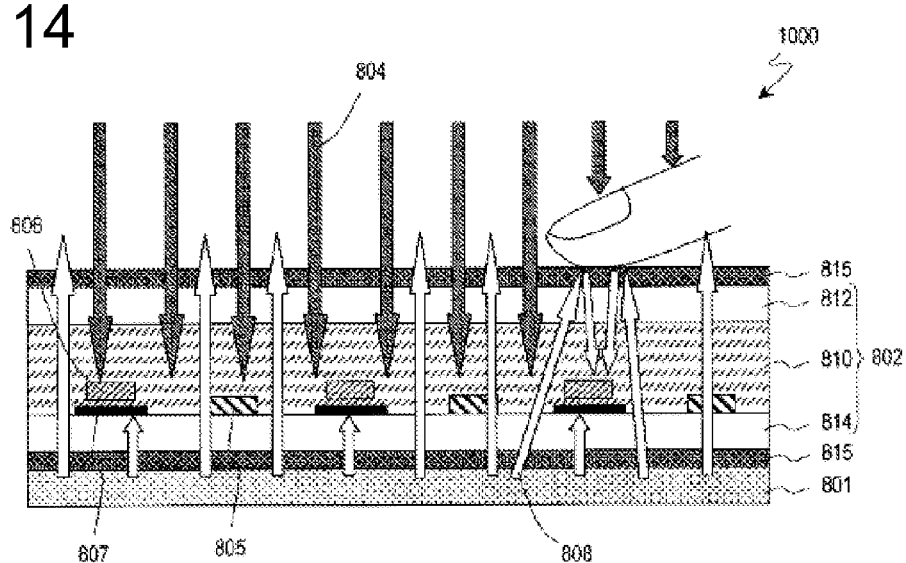
FIG. 14 is a configuration diagram of an optical sensor type touch panel of Embodiment 4 of the present invention.

FIG. 14 is a schematic cross-sectional drawing showing an example of an active matrix type touch panel liquid crystal display device.

A liquid crystal display device 1000 is equipped with a liquid crystal module 802, and a backlight 801 disposed at the backside of the liquid crystal module 802. The liquid crystal module 802 includes a transparent backside substrate 814, a front substrate 812 arranged opposite to the backside substrate, and a liquid crystal layer 810 provided between these substrates. The liquid crystal module 802 has a plurality of display units (primary color pixels), and each display unit has a pixel electrode (not illustrated) and a thin film transistor 805 connected to the pixel electrode and used for pixel switching. Moreover, an optical sensor unit including a thin film diode 806 is placed adjacent to a respective color display pixel that is constituted of three primary color (RGB) display units. Alternatively, a single optical sensor unit is arranged for two adjacent color display pixels (six display units). Although omitted from this figure, in addition to the thin film diode 806, the optical sensor unit includes at least one other thin film diode that is capable of sensing a wavelength range other than that of the thin film diode 806.

A color filter (not illustrated) is arranged at the observer side of each display unit, although a color filter is not arranged at the observer side of the optical sensor unit. A light shielding layer 807 is disposed between the thin film diode 806 and the backlight 801. Therefore, light 808 from the backlight 801 is blocked by the light shielding layer 807 and does not enter the thin film diode 806 from the back surface (from the backside substrate 814 side). Furthermore, the light shielding layer 807 should be at least disposed such that the light of the backlight 801 does not enter the intrinsic region of the thin film diode 806.

In the optical sensor unit, the first optical sensor TFD (thin film diode 806, for example) capable of sensing visible light with high sensitivity and the second optical sensor TFD (the other thin film diodes not shown in the figure) capable of sensing infrared light are connected together in parallel. The thin film diode 806 senses ambient light (visible light) 804. On the other hand, the other thin film diode (not shown in the figure) senses light 808 from the backlight 801 that has passed through the liquid crystal module 802 and then is reflected from the finger pad or the like.

Figure 15:
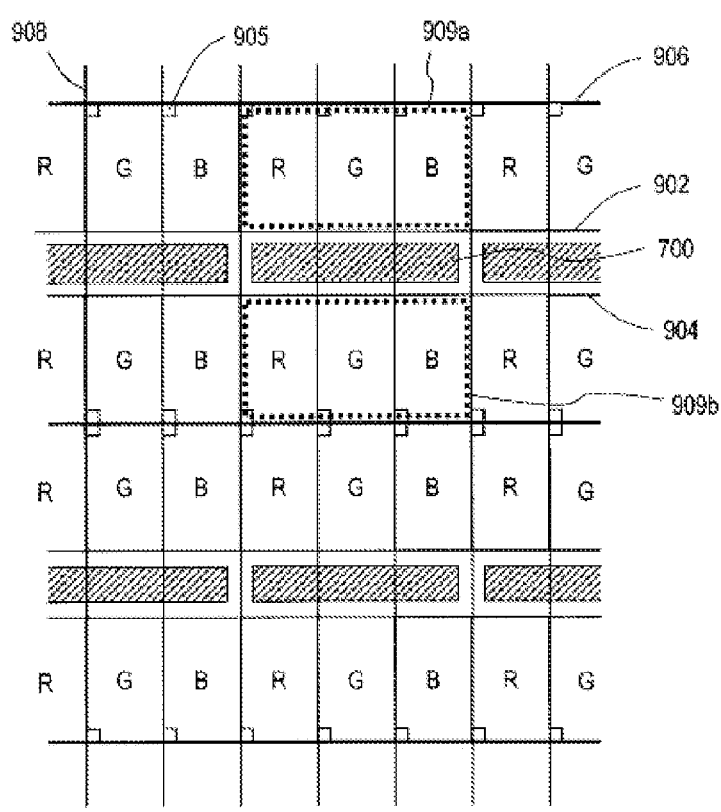
FIG. 15 is a schematic top view showing an example of the backside face substrate of the touch panel type liquid crystal display device of Embodiment 4 of the present invention.

The FIG. 15 is a schematic top view showing the backside substrate of the display device of the present embodiment. As shown in this example, a configuration is shown that provides a single optical sensor unit for two color display pixels each constituted of RGB pixels.

The backside substrate of the present embodiment is equipped with a plurality of RGB pixels arrayed as a matrix and a plurality of optical sensor units 700. Each pixel has a pixel switching thin film transistor 905 and a pixel electrode (not shown). Here, the pixel set 909*a* (909*b*) constituted of adjacent RBG pixels is termed a "color display pixel." In the present embodiment, one optical sensor unit 700 is arranged for two adjacent color display pixels 909*a* and 909*b*.

The thin film transistor 905 is configured similarly to the TFT explained for Embodiment 3, for example. In other words, it has a dual gate LLD structure having dual gate electrodes and LLD regions. The source region of the thin film transistor 905 is connected to the pixel source bus line 908, and the drain region is connected to the pixel electrode. The thin film transistor 905 is turned ON or OFF by a signal from the pixel gate bus line 906. By this means, display is performed by applying a voltage to the liquid crystal layer using the pixel electrode and the opposite electrode on the front substrate, which is arranged to face the backside substrate, thereby changing the orientation state of the liquid crystal layer.

In the present embodiment, an RST signal line 902 and an RWS signal line 904 are provided between two adjacent gate lines 906. These lines 902 and 904 are formed of the same layer as that of the gate line 906. The optical sensor unit 700 is disposed between these lines 902 and 904.

Figure 16:
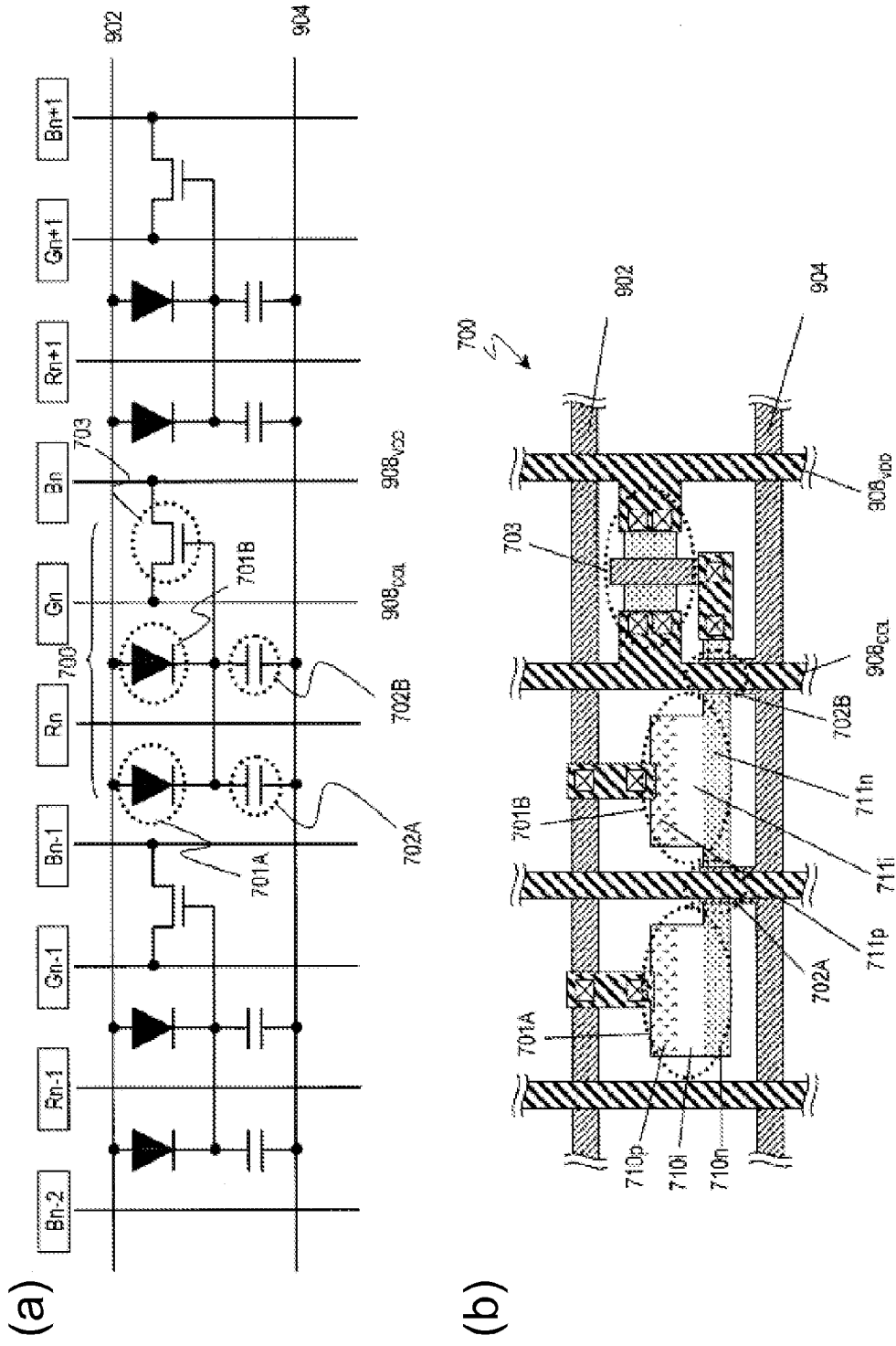
FIG. 16 (a) is a circuit diagram showing an example of the structure of an optical sensor of Embodiment 4 of the present invention, and FIG. 16 (b) is a top view showing an example of the structure of an optical sensor of Embodiment 4 of the present invention.

FIG. 16(*a*) is a circuit diagram for explaining the structure of the optical sensor unit of the present embodiment, and FIG. 16(*b*) is a top view for explaining the structure of the optical sensor unit of the present embodiment. For simplicity, constituent elements that are the same as those of FIG. 1 are assigned the same reference numerals, and explanation of such elements will be omitted.

As shown in FIG. 16(*a*), the optical sensor unit 700 has a first optical sensor thin film diode 701A, a second optical sensor thin film diode 702A, a capacitor for signal retention 702A, a capacitor for signal retention 702B, and a signal extraction thin film transistor 703. These thin film diodes 701A and 701B and the thin film transistor 703 are each disposed within a region defined by the source bus line 908, the RWS signal line 904, and the RST signal line 902.

As can be understood from FIG. 16(*b*), the first optical sensor thin film diode 701A is equipped with an amorphous Si layer that includes a p-type region 710*p*, an n-type region 710*n*, and an intrinsic region 710*i* positioned between these regions 710*p* and 710*n*. The second optical sensor thin film diode 701B is equipped with a crystalline Si layer that includes a p-type region 711*p*, an n-type region 711*n*, and an intrinsic region 711*i* positioned between these regions 711*p* and 711*n*. The amorphous Si layer of the first optical sensor thin film diode 701A and the crystalline Si layer of the second optical sensor thin film diode 701B are formed of the same layer.

The capacitors for signal retention 702A and 702B are constituted of gate electrode layers and Si layers (amorphous Si layers and crystalline Si layers) as the electrodes, and the capacitance is formed by the gate insulation film.

The p-type region 710*p* of the first optical sensor thin film diode 701A is connected to the RST signal line 902, and the n-type region 710*n* is connected to the bottom electrode (Si layer) of the capacitor for signal retention 702A and is then connected to the RWS signal line 904 through the capacitor for signal retention 702A. Similarly, the p-type region 711*p* of the second optical sensor thin film diode 701B is connected to the RST signal line 902, and the n-type region 711*n* is connected to the bottom electrode (Si layer) of the capacitor for signal retention 702B and is then connected to the RWS signal line 904 through the capacitor for signal retention 702B. Furthermore, the n-type regions 710*n* and 711*n* are connected to the gate electrode layer of the signal extraction thin film transistor 703. The source region of the signal extraction thin film transistor 703 is connected to the VDD signal line 908$_{VDD}$, and the drain region is connected to the output signal line 908$_{COL}$. The signal line 908$_{VDD}$ and the line 908$_{COL}$ are also used as source bus lines.

Operation during light sensing by the optical sensor unit 700 will be explained next.

(1) First, the RWS signal is written from the RWS signal line 904 to the capacitors for signal retention 702A and 702B. By this means, respective positive electrical fields occur on the side at which the n-type regions 710n and 711n of the first optical thin film diode 701A and the second optical thin film diode 701B are located, resulting in a reverse bias condition for the first optical thin film diode 701A and the second optical thin film diode 701B.

(2) When photo leakage occurs at at least one of the first optical sensor thin film diode 701A and the second optical sensor thin film diode 701B, the charges escape to the side at which the RST signal line 902 is located through that optical sensor thin film diode. When photo leakage occurs at only one of the optical sensor thin film diodes, current flows only through that optical sensor thin film diode. When photo leakage occurs in both optical sensor thin film diodes, then electrical current flows mainly through the optical sensor film diode that has the higher photo leakage.

(3) Then, the potential at the side of the n-type regions 710n and 711n drops, and due to this change of potential, the gate voltage applied to the signal extraction thin film transistor 703 changes.

(4) The VVD signal is applied by the VDD signal line $908_{VDD}$ to the source side of the signal extraction thin film transistor 703. When the gate voltage changes in the above described manner, the current flowing to the output signal line $908_{COL}$ connected to the drain side also changes, so it is possible to read the electrical signal from the output signal line $908_{COL}$.

(5) Thereafter, from the output signal line $908_{COL}$, electrical current is caused to flow in the forward direction in the first optical sensor thin film diode 701A and the second optical sensor thin film diode 701B to write the RST signal onto the capacitors for signal retention 702A and 702B, thereby resetting the potentials of the capacitors for signal retention 702A and 702B. At that time, resetting can be performed through the thin film diode that has the higher electrical current drive force among the optical sensor thin film diode 701A and the second optical sensor thin film diode 701B. In the present embodiment, current flows in the forward direction through the second optical thin film diode 701B, which uses a crystalline Si layer for the active region.

By repeating the above described operations of (1) through (5) by way of scanning, optical sensing becomes possible by using ambient light and backlight light.

The structure of the backside substrate in the touch panel liquid crystal display device of the present embodiment is not limited to the configuration shown in FIG. 15. For example, an auxiliary capacitance (Cs) may be provided for each pixel switching TFT. Moreover, although a single optical sensor unit was provided for two color display pixels (two pixel sets each constituted of RGB pixels) in the example shown in FIG. 15, a single optical sensor unit may be provided for a single color display pixel. Alternatively, in order to further increase the resolution, a single optical sensor unit can be provided for each pixel of the RGB primary colors. However, the aperture ratio greatly decreases in this case, and thus there is the possibility that brightness of the display may suffer.

The semiconductor device of the present embodiment is not limited to a touch panel liquid crystal display device and may also be any display device equipped with an image sensor or fingerprint sensor function. The above described optical sensor unit 700 can also be used as an image sensor or fingerprint sensor. When used as an image sensor or fingerprint sensor, in order to detect the image or fingerprint pressed against the screen, the resolution that is higher than the resolution for touch sensors is generally required. The resolution increases as the number of optical sensor units per pixel increases, and thus the number of optical sensor units may be adjusted appropriately according to the application. In the arrangement of a single optical sensor unit for two color display pixels as shown in FIG. 15, it is possible to secure sufficient resolution for reading an image of a business card or the like. Furthermore, by placing the color filter at the observer side of the optical sensor unit and by having the optical sensor unit receive light through the color filter, it is also possible to have the optical sensor unit function as a color image sensor.

Although specific embodiments of the present invention were explained above, the present invention is not limited by the above described embodiments, and various types of modifications are possible based on the technical concepts of the present invention. For example, the semiconductor device of the present invention is not limited to a display device equipped with an optical sensor unit, and the present invention may be an image sensor. A simple explanation of an image sensor using the present invention will be explained below.

The image sensor is provided with a plurality of photoreception units arrayed two dimensionally and an image information generation unit for generation of image information. Each photoreception unit may have a configuration similar to that of the display unit (pixel) shown in FIG. 15. Alternatively, the photoreception unit may be configured from three pixels (RGB pixels). Each photoreception units includes the aforementioned type of optical sensor unit 700. The image information generation unit generates image information based on the positions of the respective photoreception units and the sensing signals generated by the optical sensor units 700 of the respective photoreception unit. By this means, the image read by the image sensor can be formed or recognized.

Using the TFTs of the present invention, a circuit for analog drive and a circuit for a digital drive can be formed at the same time on a glass substrate. For example, a circuit for performing analog driving has a source-side drive circuit, a pixel part, and a gate-side drive circuit. The source-side drive circuit is equipped with a shift register, a buffer, and a sampling circuit (transfer gate). The gate-side drive circuit is equipped with a shift register, level shifter, and buffer. Alternatively, a level shifter circuit may be provided between the sampling circuit and the shift register, if required. Moreover, memories and microprocessors can also be manufactured by the manufacture method of the present invention.

INDUSTRIAL APPLICABILITY

The present invention can be used for a semiconductor device equipped with an optical sensor TFDs and any electronic devices having such a semiconductor device in a wide range of fields. For example, the present invention may be used for a CMOS circuit or pixel part in an organic electroluminescent display device or an active matrix type liquid crystal display device. This type of display device can be used, for example, as a display screen for a mobile phone or mobile game machine, a monitor of a digital camera, or the like. Therefore, the present invention can be used for any electronic devices incorporating a liquid crystal display device or organic electroluminescent display device.

The present invention can be suitably utilized in display devices, such as active matrix type liquid crystal display devices, organic electroluminescent display devices, and the like, in image sensors, optical sensors, and in electronic devices incorporating such. The present invention is especially advantageous when used in a display device equipped with an optical sensor function using TFDs and in electronic devices equipped with such a display device. The present invention can also be used for an image sensor equipped with an optical sensor using TFDs and a drive circuit using TFTs.

DESCRIPTION OF REFERENCE CHARACTERS 700 optical sensor unit
701A optical sensor thin film diode
701B optical sensor thin film diode
702 capacitor for signal retention
703 signal extraction thin film transistor
704 node
100 semiconductor device
101 substrate
102b, 102c light shielding layer
103, 104 base film
105 amorphous silicon film
105a crystallized region
105b amorphous region
108a, 108b island-shape semiconductor layer (crystalline silicon layer)
108c island-shape semiconductor layer (amorphous silicon layer)
109 gate insulation film
110 gate electrode
111, 111c, 115a, 115b, 115c mask
112 n-type impurity (phosphorus)
113a source-drain regions
113b, 113c n-type region
114 channel region
116 p-type impurity (boron)
117b, 117c p-type region
118b, 118c intrinsic region
120, 121 interlayer insulation film
122 thin film transistor electrode-line
123b, 123c, 124b, 124c thin film diode electrode-line
125 thin film transistor
126 optical sensor thin film diode
127 optical sensor thin film diode

The invention claimed is:

1. A semiconductor device comprising:
a substrate; and
an optical sensor unit formed on said substrate for sensing light and generating a sensing signal, said optical sensor unit including a first thin film diode for sensing light of a first wavelength range, and a second thin film diode for sensing light of a second wavelength range including a wavelength longer than the maximum wavelength of said first wavelength range,
wherein said first thin film diode and said second thin film diode are connected in parallel,
wherein said sensing signal is generated based on output of one of said first thin film diode and said second thin film diode,
wherein said first thin film diode has a first semiconductor layer; said second thin film diode has a second semiconductor layer; and the bandgap of said first semiconductor layer is greater than the bandgap of said second semiconductor layer, and
wherein the crystalline state of said first semiconductor layer differs from the crystalline state of said second semiconductor layer.

2. The semiconductor device according to claim 1, wherein the bandgap of said first semiconductor layer is greater than 1.39 eV, and the bandgap of said second semiconductor layer is less than 1.30 eV.

3. The semiconductor device according to claim 1, wherein said first semiconductor layer is an amorphous semiconductor layer, and said second semiconductor layer is a crystalline semiconductor layer.

4. The semiconductor device according to claim 1, wherein the thickness of said first semiconductor layer is greater than the thickness of said second semiconductor layer.

5. The semiconductor device according to claim 1, wherein the semiconductor device further comprises a thin film transistor formed on said substrate.

6. The semiconductor device according to claim 5, wherein said thin film transistor has a third semiconductor layer, and
wherein said third semiconductor layer is formed from an amorphous semiconductor film from which at least one of said first semiconductor layer and said second semiconductor layer is also formed.

7. The semiconductor device according to claim 6, wherein said second semiconductor layer and said third semiconductor layer are crystalline semiconductor layers formed by crystallizing said amorphous semiconductor film;
and said first semiconductor layer is an amorphous semiconductor layer formed of an amorphous semiconductor film that is different from said amorphous semiconductor film.

8. The semiconductor device according to claim 6, wherein said first semiconductor layer, said second semiconductor layer, and said third semiconductor layer are formed from said amorphous semiconductor film.

9. The semiconductor device according to claim 1, wherein said first semiconductor layer has a stacked structure comprising a p-type semiconductor film, an n-type semiconductor film, and a substantially intrinsic semiconductor film disposed between said p-type semiconductor film and said n-type semiconductor film,
wherein said second semiconductor layer comprises at least a p-type region and an n-type region.

10. The semiconductor device according to claim 1, wherein said first semiconductor layer and said second semiconductor layer each comprise at least a p-type region and an n-type region.

11. The semiconductor device according to claim 1, further comprising:
a plurality of photoreception parts arrange in a two dimensional array, each photoreception part including said optical sensor unit; and
an image information generation unit that generates an image data relating to the position of the respective photoreception parts and said sensing signals generated by said optical sensor units of the respective photoreception parts.

12. The semiconductor device according to claim 1, further comprising a plurality of display units arranged in a two dimensional array,
wherein said optical sensor unit is disposed corresponding to a respective display unit or a set of two or more display units.

13. A semiconductor device comprising:
a substrate; and
an optical sensor unit on said substrate for sensing light and generating a sensing signal, said optical sensor unit including a first thin film diode having an amorphous semiconductor layer, and a second thin film diode having a crystalline semiconductor layer, wherein said first thin film diode and said second thin film diode are connected in parallel, and wherein said sensing signal is generated based on output of one of said first thin film diode and said second thin film diode.

14. A display device comprising:
a display region having a plurality of display units; and
a plurality of the semiconductor devices as set forth in claim 1 provided in said display region, each of the the semiconductor devices detecting light to generate the sensing signal,
wherein each display unit has an electrode and a thin film transistor connected to said electrode.

15. The display device according to claim 14, further comprising a backlight that emits visible light and infrared light,
wherein said second thin film diode is capable of sensing said infrared light.

16. The display device according to claim 14, wherein each of said semiconductor devices is disposed in said display region corresponding to a respective display unit or a respective set of two or more display units.

17. A method for manufacturing a semiconductor device comprising a substrate, an optical sensor unit formed on said substrate that includes a first thin film diode and a second thin film diode, and a thin film transistor formed on said substrate, the method comprising:
(a) forming an amorphous semiconductor film on said substrate;
(b) from said amorphous semiconductor film, forming a second island-shape semiconductor layer that becomes an active region of said second thin film diode, and a third island-shape semiconductor layer that becomes an active region of said thin film transistor; and
(c) forming on said substrate a first island-shape semiconductor layer that becomes an active region of said first thin film diode,
wherein the bandgap of said first island-shape semiconductor layer is larger than the bandgap of said second island-shape semiconductor layer,
wherein said step (b) and said step (c) include:
crystallizing a part of said amorphous semiconductor film to form a semiconductor film including a crystalline region and an amorphous region; and
patterning said semiconductor film to form said second and third island-shape semiconductor layers from said crystalline region, and to form said first island-shape semiconductor layer from said amorphous region.

18. The method for manufacturing a semiconductor device according to claim 17,
wherein said step (a) forms the amorphous semiconductor film that has a thicker portion, and wherein said step (b) and step (c) includes:
forming a semiconductor film including a crystalline region and an amorphous region, by leaving said thicker portion of the amorphous semiconductor film as amorphous, and by crystallizing other portions of the amorphous semiconductor film; and
patterning said semiconductor film to form said second and third island-shape semiconductor layers from said crystalline region, and to form said first island-shape semiconductor layer from said amorphous region.

19. A method for manufacturing a semiconductor device comprising a substrate, an optical sensor unit formed on said substrate that includes a first thin film diode and a second thin film diode, and a thin film transistor formed on said substrate, the method comprising:
(a) forming an amorphous semiconductor film on said substrate;
(b) from said amorphous semiconductor film, forming a second island-shape semiconductor layer that becomes an active region of said second thin film diode, and a third island-shape semiconductor layer that becomes an active region of said thin film transistor; and
(c) forming on said substrate a first island-shape semiconductor layer that becomes an active region of said first thin film diode,
wherein the bandgap of said first island-shape semiconductor layer is larger than the bandgap of said second island-shape semiconductor layer,
wherein said step (b) includes:
crystallizing said amorphous semiconductor film to form a crystalline semiconductor film; and
patterning said crystalline semiconductor film to form said second and third island-shape semiconductor layers,
wherein said step (c) is performed after said step (b), and
wherein said first island-shape semiconductor layer is an amorphous semiconductor layer.

20. The method for manufacturing a semiconductor device according to claim 19, further comprising, after said step (b) and prior to said step (c), forming on said second island-shape semiconductor layer a conductive layer electrically contacting said second island-shape semiconductor layer,
wherein in said step (c), said first island-shape semiconductor layer has a stacked structure including, in the following order:
an amorphous semiconductor layer of first conduction type formed on said conductive layer;
a substantially intrinsic amorphous semiconductor layer; and
an amorphous semiconductor layer of second conduction type different from said first conduction type.

* * * * *